(12) United States Patent
Mallett

(10) Patent No.: US 9,698,809 B1
(45) Date of Patent: Jul. 4, 2017

(54) SYSTEMS AND METHODS FOR ANALOG TO DIGITAL CONVERTER FAILURE IDENTIFICATION

(71) Applicant: Schweitzer Engineering Laboratories, Inc., Pullman, WA (US)

(72) Inventor: Travis C Mallett, Pullman, WA (US)

(73) Assignee: Scweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/213,993

(22) Filed: Jul. 19, 2016

(51) Int. Cl.
*H03M 1/10* (2006.01)
*H03M 1/12* (2006.01)
*H03M 3/00* (2006.01)

(52) U.S. Cl.
CPC ....... *H03M 1/1071* (2013.01); *H03M 1/1245* (2013.01); *H03M 3/458* (2013.01)

(58) Field of Classification Search
CPC ...... H03M 1/12; H03M 1/1071; H03M 1/109; H03M 1/10; H03M 1/1042; H03M 1/0641
USPC .................................................. 341/118–121
See application file for complete search history.

(56) References Cited

U.S. PATENT DOCUMENTS

| | | | |
|---|---|---|---|
| 4,470,303 A | 9/1984 | O'Donnell | |
| 4,795,963 A * | 1/1989 | Ueno | H03M 1/1095 324/601 |
| 5,132,685 A * | 7/1992 | DeWitt | G01R 31/318502 324/73.1 |
| 7,154,422 B2 * | 12/2006 | Wen | H03M 1/109 341/120 |
| 7,176,816 B2 * | 2/2007 | Koerner | H03M 1/1076 341/118 |
| 7,286,068 B2 | 10/2007 | Stanley | |
| 7,557,572 B1 | 7/2009 | Hertz | |
| 8,330,437 B1 | 12/2012 | Hartman | |
| 2005/0038623 A1 * | 2/2005 | Hammerschmidt | G01R 31/2829 702/118 |
| 2007/0236239 A1 * | 10/2007 | Bucksch | G01R 31/31926 324/750.3 |
| 2007/0288832 A1 * | 12/2007 | Adachi | H03M 13/27 714/780 |
| 2013/0106632 A1 * | 5/2013 | Petigny | H03M 1/1004 341/120 |

(Continued)

OTHER PUBLICATIONS

Siemens, Siprotec 5: Modular Hardware Design, 03 Hardware Overview SIPROTEC 5/DIGSI 5 Basic Course, Siemens Power Academy TD, Version: D_02_Page 26, Jan. 2012.

(Continued)

*Primary Examiner* — Linh Nguyen
(74) *Attorney, Agent, or Firm* — Stoel Rives, LLP; Richard M. Edge

(57) ABSTRACT

Disclosed are systems and methods for identifying and reporting failures of an analog to digital (A/D) conversion system. An A/D conversion system includes a test signal generator configured to generate a test signal including an identifiable characteristic, an A/D converter configured to convert an analog signal measured at an input of the A/D converter to a digital output, and signal injection circuitry configured to inject at least a portion of the test signal from the test signal generator as an injected signal into the analog signal using trace-to-trace crosstalk. A method includes determining whether the digital output generated by the A/D converter indicates the identifiable characteristic.

20 Claims, 15 Drawing Sheets

(56) References Cited

U.S. PATENT DOCUMENTS

2013/0169456 A1* 7/2013 Cheong ................ H03M 1/108
                                                            341/120
2013/0293402 A1* 11/2013 Naudet ............... H03M 1/1071
                                                            341/120

OTHER PUBLICATIONS

Etzel, M.; Jenkins, W., "Redundant residue number systems for error detection and correction in digital filters," Acoustics, Speech and Signal Processing, IEEE Transactions on , vol. 28, No. 5, pp. 538,545, Oct. 1980. URL: http://ieeexplore.ieee.org/stamp/stamp.jsp?tp=&arnumber=1163442&isnumber=26148.

Singh, M.; Koren, I., "Fault-sensitivity analysis and reliability enhancement of analog-to-digital converters," Very Large Scale Integration (VLSI) Systems, IEEE Transactions on , vol. 11, No. 5, pp. 839,852, Oct. 2003 URL: http://ieeexplore.ieee.org/stamp/stamp.jsp?tp=&arnumber=1234403&isnumber=27663.

Willsky, Alan S. "A survey of design methods for failure detection in dynamic systems." Automatica 12.6 (1976): 601-611. URL: http://www.sciencedirect.com/science/article/pii/0005109876900418.

* cited by examiner

SYSTEMS AND METHODS FOR ANALOG TO DIGITAL CONVERTER FAILURE IDENTIFICATION

TECHNICAL FIELD

This disclosure relates to validation and measurement systems and methods in electric power delivery systems. More particularly, this disclosure relates to analog to digital converter failure identification.

BRIEF DESCRIPTION OF THE DRAWINGS

Non-limiting and non-exhaustive embodiments of the disclosure are described herein, including various embodiments of the disclosure with reference to the figures listed below.

Figure 1:
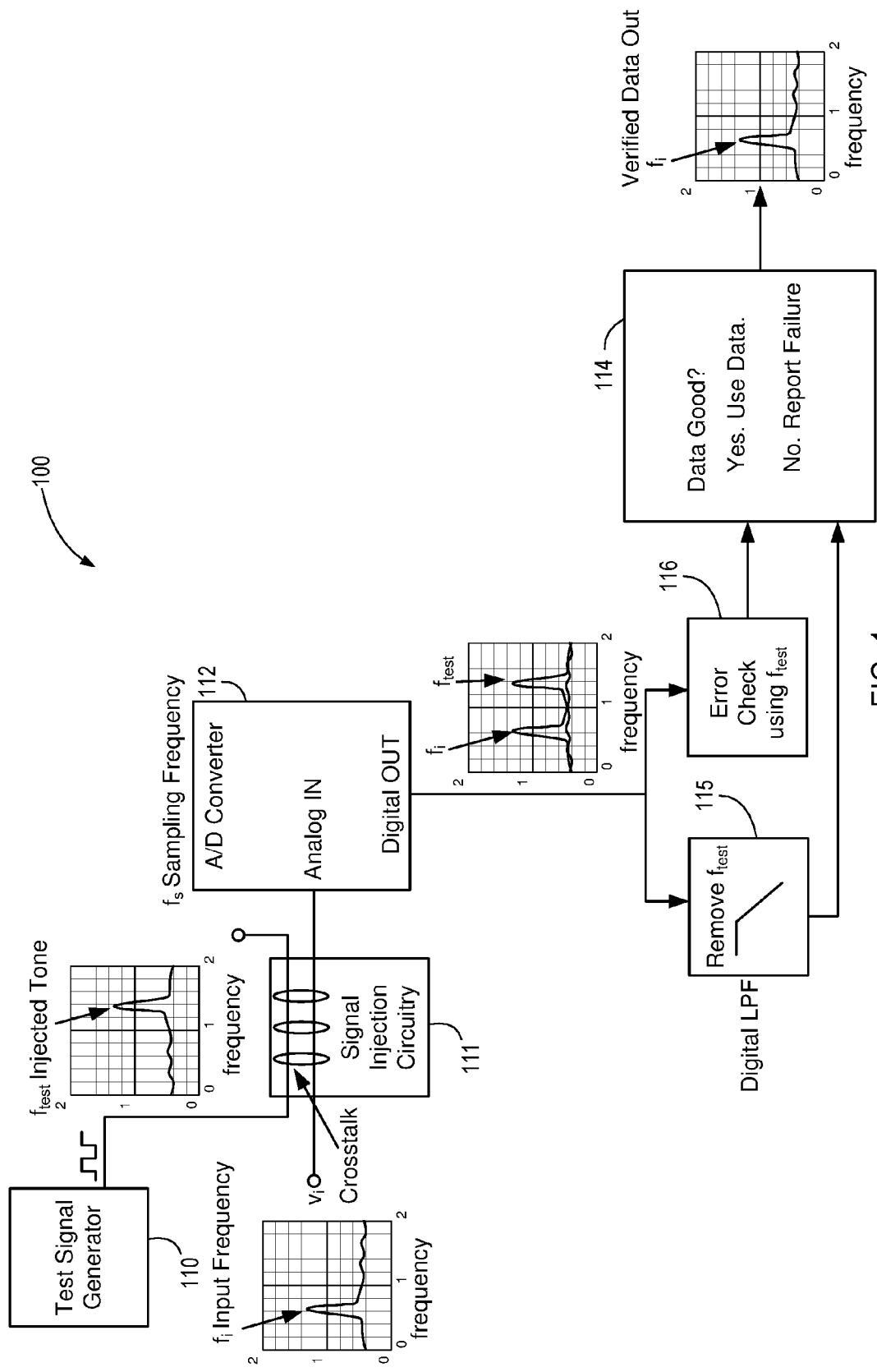
FIG. 1 illustrates a system for detecting a failure of an A/D converter, according to some embodiments.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Protection relays may be installed in electric power generation, transmission, and distribution facilities to detect overloads, short circuits, and other fault conditions. For example, large amounts of current may flow through a power line into a ground or other shorting medium in response to one or more short circuit faults. A protective relay (e.g., a digital protective relay) may be configured to detect a fault condition (e.g. a short circuit fault) based on an overcurrent element associated with a specific amount of current and may trip a breaker, clearing the fault. In some embodiments, protective relays may be deemed "mission critical" equipment for the integrity of the power system and personal safety of the users and operators. In many embodiments and configurations of a protective relay, the reliability and proper function of a protective relay may be of utmost concern.

Many embodiments of a protective relay are electronic devices employing FPGAs, microcontrollers, CPUs, analog to digital (A/D) converters, electronic displays, communication ports, and other electronic devices and systems to digitize power system currents and/or voltages and/or process data associated with the digitized currents and voltages according to various algorithms and/or digital filters. A protective relay may be configured to make protection decisions based on data associated with a digitized power system currents and/or voltages, and may communicate decisions made by a protective relay to an appropriate system or personnel, and/or may otherwise cause a suitable response to the digitized power system currents and/or voltages.

While the reliability of many essential electronic devices and systems in a protective relay have been thoroughly investigated, decisions made by a protective relay may only be as reliable as any digitized current and/or voltage data communicated to the protective relay from an A/D converter. If an A/D converter communicates false or inaccurate information to a protective relay without any indication of one or more errors associated with the communicated information, the protective relay may act based on the received false or inaccurate data, and may cause unintended consequences known as an "unintended operation" (UO).

One or more embodiments disclosed herein may be configured to communicate with, control, operate, energize, de-energize, and/or disengage one or more power system protection elements, such as a protection relay. Protection relays may be installed in electric power transmission and distribution facilities to detect overloads, short circuits, and other fault conditions.

This disclosure includes methods and systems to enable an A/D conversion system to detect, measure, report, and/or communicate: an A/D converter failure, a failure in the analog signal conditioning and amplification, and/or a failure in digital communication upstream of the A/D converter.

In some embodiments, disclosed is an analog to digital (A/D) conversion system with failure identification. The A/D conversion system includes a test signal generator configured to generate a test signal including an identifiable characteristic. The A/D conversion system also includes an A/D converter configured to convert an analog signal measured at an input of the A/D converter to a digital output. The A/D conversion system further includes signal injection circuitry configured to inject at least a portion of the test signal from the test signal generator as an injected signal into the analog signal measured at the input of the A/D converter using trace-to-trace crosstalk. Signal injection circuitry of the A/D conversion system is configured to aid in determining existence, non-existence, or variation of the identifiable characteristic in the digital output. The digital output may optionally be filtered to remove the identifiable characteristic from the digital output. In some embodiments, however, frequencies of the identifiable characteristic may be well out of the bandwidth of the signals of interest, and may not need to be filtered. A failure notification may be provided based on a determination that the identifiable characteristic does not exist in the digital output, or has changed in a manner indicative of an A/D.

In some embodiments, disclosed is an intelligent electronic device (IED) configured to identify a failure in an analog to digital (A/D) converter. The IED includes signal injection circuitry, a meter, a frequency characteristic module, and an error reporting module. The signal injection circuitry is configured to inject one or more frequency characteristics into an input of an A/D converter using crosstalk between an injection trace and the input of the A/D converter. An analog signal carried to the input of the A/D converter includes a frequency $f_a$, and the one or more frequency characteristics injected by the injection circuitry include another frequency $f_{test}$, a superposition of the analog signal and the one or more frequency characteristics including $f_a+f_{test}$. The meter is configured to obtain a measurement of an output of the A/D converter. The frequency characteristic module is configured to determine that the one or more frequency characteristic, $f_{test}$, is missing or exhibits significant variation from the output of the A/D converter. The error reporting module is configured to report a failure of the A/D converter based on the determination that the frequency characteristic, $f_{test}$, is missing or exhibits significant variation from an expected behavior.

In some embodiments, disclosed is a method for verifying a digital output of an analog to digital (A/D) converter. The method includes injecting an injected signal having an identifiable characteristic into an analog input of an A/D converter through crosstalk between a signal line carrying a test signal and an analog line associated with the analog input. The method also includes generating, via the A/D converter, a digital output comprising a digital version of an analog signal carried by the analog line and the injected signal, and determining whether the digital output generated by the A/D converter indicates the identifiable characteristic.

For example, an A/D conversion system with failure identification may include a test signal generator and signal injection circuitry configured to inject a test signal generated by the test signal generator into an analog trace carrying analog signals prior to an input to an A/D converter using trace-to-trace crosstalk. Conventional implementations of signal injection are costly and often complex. The use of trace coupling provides a method of error checking using techniques that may incur zero (or nearly zero) additional hardware costs.

The A/D converter may receive the superposition of the test signal and the analog signal, and convert the combined signal to a digital output. A failure identification module may determine the existence or non-existence and/or deviation of an identifiable characteristic from an expected behavior of the test signal in the digital output. In some embodiments a frequency domain analysis of a fast Fourier transform of the output of the A/D converter may be used. A filter may filter the digital output to remove the test signal from the digital output. Additionally, an alert module may provide a failure notification based on a determination by the failure identification module that the test signal does not exist in the digital output or has changed behavior in a manner indicative of an A/D and/or analog circuit failure.

The analysis, failure determination, verification, and/or the like may be determined by an intelligent electronic device (IED). The IED may include a meter to identify a characteristic of the test signal injected by the trace coupling circuitry into an input of an A/D converter. The characteristic may correspond to a frequency and/or magnitude of the test signal. The meter may take actual measurements, retrieve data from storage, and/or receive data from an external measurement device. For example, the meter may measure the frequency by measuring an output of the test signal generator.

The meter may be further used to obtain a measurement of an output of the A/D converter. A frequency characteristic module may determine that the frequency characteristic, $f_c$, is missing from the output of the A/D converter and an error reporting module may then report a failure of the A/D converter and/or analog circuitry based on the determination that the frequency characteristic, $f_c$, is missing from the output of the A/D converter or has changed behavior in a manner indicative of an A/D and/or analog circuit failure. The frequency characteristic module may determine that the frequency characteristic is missing or otherwise different from expected based on a frequency domain analysis of a fast Fourier transform of the output of the A/D converter.

Any of a wide variety of systems and methods may be adapted to perform the systems and methods described herein. In various embodiments, an IED or other device may verify a digital output of an A/D converter and/or provide an alert when the A/D converter experiences or appears to be experiencing an error. The injected or identifiable signals and characteristics described herein may be directly and intentionally injected or alternatively may simply correspond to the inherent characteristics of components connected upstream of the A/D converter.

Some embodiments of an A/D conversion system may include one or more IEDs, which may be used for monitoring, protecting, and/or controlling industrial and utility equipment, such as in electric power delivery systems. IEDs within an A/D conversion system may be configured to perform metering, control, and protection functions that require a certain level of accuracy. Further, IEDs may be configured to obtain measurement information from A/D converters, and may be configured to identify any potential failures of an A/D converter from which the IED is receiving data. Specifically, the health of an A/D converter may be monitored and/or validated on a regular basis (e.g., at predetermined time periods or in response to a specific event) by determining the existence and/or behavior of a known characteristic of a signal injected by signal injection circuitry to ensure that it is functioning correctly and/or that any failure of the A/D converter is identified and/or reported. Errors and/or abnormalities can then be identified and reported.

The IED may utilize a common time source, such as a time signal provided by a global positioning system (GPS) or via a time-syncing standard such as IEEE 1588 to time-align the collected measurement data. Accordingly, the IED may be time-aligned to allow for synchrophasors to be calculated. Additionally, the IED may utilize identical or similar sampling and processing algorithms for the collected measurement data of several A/D converters to further facilitate the calculations of accurate synchrophasors.

However, in many situations, the IED may utilize unsynchronized time signals and/or alternative sampling and processing algorithms for the collected data of one or more A/D converters. For example, a system may include any number of A/D converters that are different models and/or utilize independent time signals. In such embodiments, the data collected may not be inherently time-aligned. If different model A/D converters are used and/or the converters are not time-aligned, then an event trigger common to both A/D converters may be used to align the measurement data from each converter. For example, each A/D converter may be configured to begin collecting data when a power system event or anomaly is detected, such as when an overcurrent is detected.

An A/D conversion system may include a single IED to monitor a particular A/D converter. In other embodiments, the input of the single IED may be time-synchronized with some synchronous signal as described above. In still other embodiments of an A/D conversion system, two or more IEDs may be configured to monitor the same A/D converter. The collected measurement data of the two or more IEDs may be synchronized using any of a wide variety of methods and approaches, including those previously described.

With the measurement data from each A/D converter time-aligned, the IED may determine via a meter, a plurality of output voltages for each A/D converter at times corresponding to common event triggers. The plurality of output voltages for the measurement data collected by the IED should be approximately the same, since they are aligned with respect to one another using the common event triggers, and/or are collected from two or more A/D converters in a parallel electronic configuration. The collected measurement data corresponding to the output voltages of a first and second A/D converter may be identical and/or significantly similar in magnitude.

The systems and methods described herein may be expanded for use in an enterprise and/or industrial environment in which a validation module or validation device may be in communication with any number (i.e., hundreds or even thousands) of pairs of IEDs functioning in dual-primary or primary-backup configurations. Accordingly, a centralized validation system may be capable of remotely validating the functionality of measurement devices and/or IEDs throughout an electric power delivery system. Similarly, a validation module or validation device may be adapted to monitor and regularly validate the functionality of measurement devices and/or IEDs within a substation of an electric power delivery system.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc. that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates a system 100 for detecting a failure of an A/D converter 112, according to some embodiments. The system 100 may include a test signal generator 110, signal injection circuitry 111, the A/D converter 112, and an IED 114 configured with a variety of modules to implement one or more functions and/or operations. The system 100 may be configured to measure one or more pluralities of consecutive voltages to detect a failure of the A/D converter 112, and to operate one or more components of a power system based, at least in part, on whether a failure is detected.

An input of the A/D converter 112 may be operably coupled to one or more components of interest of a power system to enable the A/D converter 112 to measure and/or monitor a voltage $v_i$ associated with the components of interest. By way of non-limiting example, the voltage $v_i$ may correspond to a current or voltage on an electric power line conducted to the A/D converter 112 via an electrical trace (e.g., directly from a power line, indirectly from the power line through an amplifier, etc.).

The test signal generator 110 is configured to generate a test signal (e.g., a square wave, a single sinusoidal tone, etc.), and deliver the test signal to the signal injection circuitry 111. In some embodiments, the test signal generator 110 includes a field programmable gate array (FPGA), a central processing unit (CPU), an oscillator (a square wave oscillator, a sinusoidal oscillator, etc.), a switching device, or combinations thereof.

The signal injection circuitry 111 is configured to inject an injected signal having one or more known identifiable characteristics (e.g., a test tone frequency $f_{test}$, a magnitude, a phase shift, etc.) into the voltage $v_i$ using trace-to-trace crosstalk. The test tone frequency $f_{test}$ may be selected to be different from a known frequency fi of voltage $v_i$ (e.g., a few times larger than fi). By way of non-limiting example, the combination of the voltage $v_i$ with the injected signal may be a superposition of the voltage $v_i$ with the test signal generated by the test signal generator 110. Accordingly, the input of the A/D converter 112 is configured to receive and digitize the voltage $v_i$ with the injected signal injected therein.

The system 100 validates the integrity of the digitized data from the A/D converter 112. Specifically, the system 100 analyzes an output of the A/D converter 112 to determine if the one or more known identifiable characteristics of the injected signal are accurately reflected in the output of the A/D converter 112. By way of non-limiting example, if an injected signal portion of the digitized data is too strong or too weak, the system could declare an error and the analog data accompanied can be deemed unreliable and not used for power system protection purposes. Also by way of non-limiting example, if the $f_{test}$ signal is of the appropriate frequency and magnitude, the A/D converter 112 can be determined to be in good health and the digitized version of the analog signal $v_i$ trustworthy.

In some embodiments, the identifiable characteristic of the injected signal may be a single test tone frequency $f_{test}$. The test tone frequency $f_{test}$ may include a center frequency and a non-zero magnitude with a distribution or waveform shape that may be known based on the center frequency of the test tone frequency $f_{test}$. The IED 114 may measure and/or determine the magnitude and the center frequency corresponding to the test tone frequency $f_{test}$.

The test tone frequency $f_{test}$ may be configured to be several times larger than the frequency of the signal of interest $v_i$. For example, the frequency of the signal of interest may be less than 200 Hertz and the test tone frequency $f_{test}$ may be at least about 5,000 Hertz.

The A/D converter 112 may receive the voltage $v_i$ and the injected signal and may output corresponding output voltages and/or voltage measurements to the IED 114. The IED 114 may duplicate the received output voltages, and/or may perform several functions and/or operations on each of the output voltages.

The IED 114 may be configured to implement a digital low-pass filter function 115, a comparator function, and/or an error check function 116. The IED 114 may receive both a first and a second plurality of consecutive voltages from a meter. The IED 114 may perform the low-pass filter function 115 on one copy of the received plurality of consecutive voltages, and may perform a fast Fourier transform operation on another unfiltered copy of the received plurality of consecutive voltages. The IED 114 may determine the first magnitude of the test tone frequency $f_{test}$ based on an analysis of the unfiltered plurality of consecutive voltages in the frequency domain (e.g., following the fast Fourier transform of the data). The IED 114 may report an error of the A/D converter 112 and/or analog circuitry via a communication module and/or a communication link.

As previously discussed, the signal injection circuitry 111 injects the injected signal using trace-to-trace crosstalk. Such crosstalk occurs because of electromagnetic fields are produced when the test signal is conducted by a trace and the electromagnetic fields induce electrical currents and/or voltages on a trace that carries the voltage $v_i$ of interest to the A/D converter 112.

Figure 2:
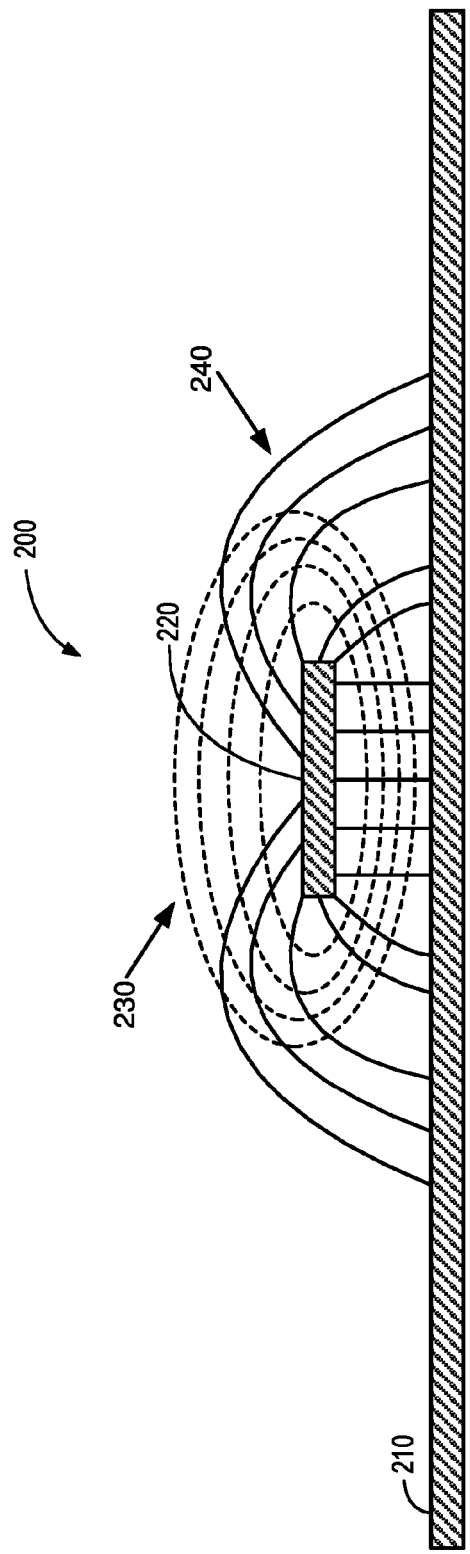
FIG. 2 is a simplified cross-sectional view of an electronic circuit and illustrating electromagnetic fields produced by a trace.

FIG. 2 is a simplified cross-sectional view of an electronic circuit 200 and illustrating electromagnetic fields produced by a trace 220. The electronic circuit 200 includes a power plane 210 (e.g., a ground plane, a positive voltage plane, a negative voltage plane, etc.), and the trace 220. As the trace 220 conducts the test signal, electric fields 240 (shown in solid lines) and magnetic fields 230 (shown in broken lines) are generated around the trace 220. These electric fields 240 and magnetic fields 230 can induce electrical currents on and interfere with other traces nearby the trace 220, as discussed with reference to FIG. 3.

Figure 3:
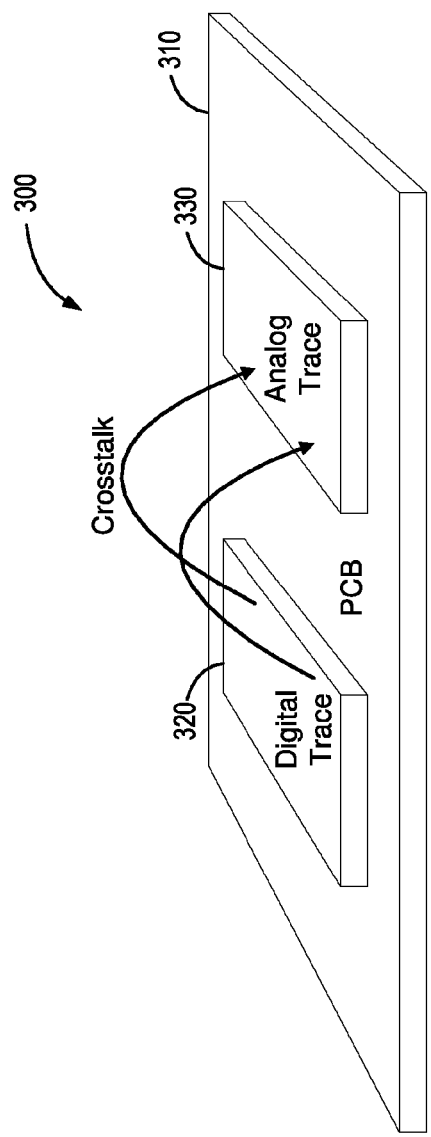
FIG. 3 is a simplified illustration of crosstalk between traces of an electronic circuit.

FIG. 3 is a simplified perspective view of an electronic circuit 300 similar to the electronic circuit 200 of FIG. 2. The electronic circuit 300 includes a printed circuit board 310 (PCB 310) carrying a digital trace 320 and an analog trace 330. The digital trace 320 is configured to conduct the test signal generated by the test signal generator 110 of FIG. 1. The analog trace 330 is configured to conduct the voltage of interest $v_i$ of FIG. 1 to the A/D converter 112 of FIG. 1.

High-frequency signals can easily couple between traces located closely together (e.g., between digital trace 320 and analog trace 330). The analog trace 330 may contain little high-frequency content. Analog signals in power systems are typically band limited, and may have relatively low frequencies (e.g., under about 200 Hertz). Accordingly, the analog trace 330 will not likely be an aggressor in a geometry suited to trace-to-trace crosstalk; the analog trace 330 will more likely be a victim of trace-to-trace crosstalk.

Crosstalk is generally avoided during circuit layout. For example, as would be understood by those of ordinary skill in the art, traces carrying digital signals are typically located as far away as possible from analog traces to avoid crosstalk. The electronic circuit 300, however, has been designed to enable crosstalk between the digital trace 320 and the analog trace 330 to inject the injected signal into the voltage of interest $v_i$ prior to the A/D converter 112 (FIG. 1).

There are various ways of implementing the signal injection circuitry 111. FIGS. 4-8 illustrate some examples of such signal injection circuitry 111.

Figure 4:
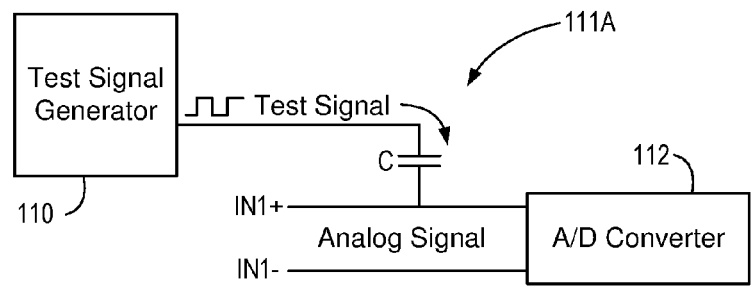
FIG. 4 is a simplified schematic view of signal injection circuitry according to some embodiments.

FIG. 4 is a simplified schematic view of signal injection circuitry 111A according to some embodiments. The injected signal could be injected by connecting a capacitor C between a trace conducting the test signal (e.g., trace 320) and a trace conducting analog signals (e.g., IN1+, IN1−) to an input of the A/D converter 112. In other words, the injected signal could be injected through the capacitor C. Such injection, however, has the side-effect of adding potentially unwanted capacitance to the analog input circuitry. This needs to be taken into account during the accuracy analysis as the additional capacitance can cause phase shifts or magnitude attenuation in the analog signal (e.g., $v_i$).

Referring again to FIG. 1, crosstalk between traces is often through a mutual partial inductance rather than a capacitance. In fact, capacitive coupling is often very small in 50Ω circuits. Provided there is little current flowing into the A/D converter 112, the mutual inductance between the analog input of the A/D converter 112 and the test signal trace will have little or no effect on the performance of the analog system when the test tone is not being injected.

Many types of waveforms could be generated and coupled into the analog trace as test signals. One of the simplest, however, is a square wave generated by a digital device. An advantage of using a digital switching waveform is that the signal is controllable (e.g., the waveform can be turned on and off at will and the frequency is easily set by firmware). Additionally, the digital square wave uses almost no additional components other than a driver (e.g., an FPGA), a PCB trace, and a resistive or capacitive load.

While a square wave test signal has the downside of containing many harmonics of a fundamental frequency, coupling through a mutual inductance or capacitance may allow just edges of a square wave to be injected as injected signals, giving regular pulses at the fundamental frequency.

It may be desirable to increase mutual inductance between an injection trace and the analog input signals to allow the injected signal to stand out above a noise floor. Examples of geometries for injection trace layouts are discussed with reference to FIGS. 5-8.

Figure 5:
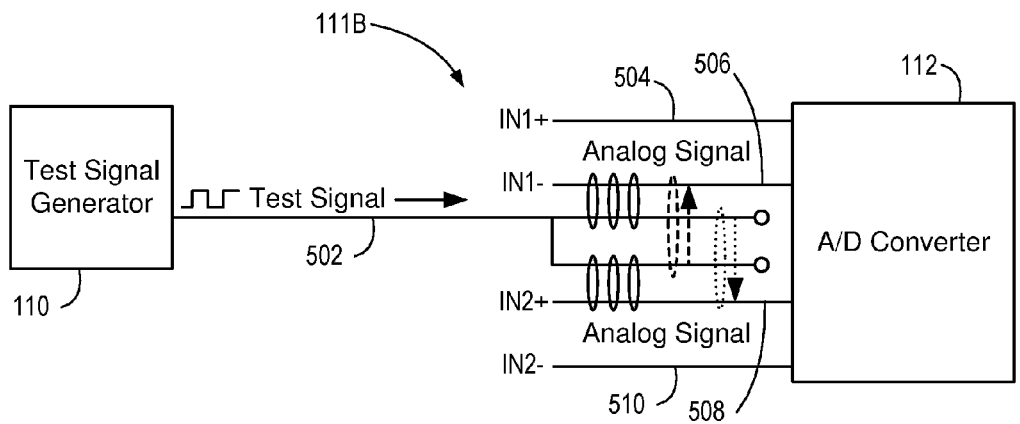
FIG. 5 is a simplified schematic view of signal injection circuitry according to some embodiments.

FIG. 5 is a simplified schematic view of signal injection circuitry 111B according to some embodiments. The signal injection circuitry 111B includes an injection trace 502 and analog signal traces 504, 506, 508, 510 configured to carry analog input signals IN1+, IN1−, IN2+, IN2−, respectively. It may be desirable to increase mutual inductance between the injection trace 502 and the analog signal traces 504, 506, 508, 510 to allow the injected signal (e.g., a test-tone) to stand out above a noise floor. In the signal injection circuitry 111B of FIG. 5, the injection trace 502 splits so that analog signal traces 506, 508 receive strong coupling (illustrated using solid lines). The injection trace 502 near IN2+ also couples into IN1− (illustrated using dashed lines) and the injection trace 502 near IN1− couples into IN2+ (illustrated using dotted lines), which increases the effective coupling mechanism.

Figure 6:
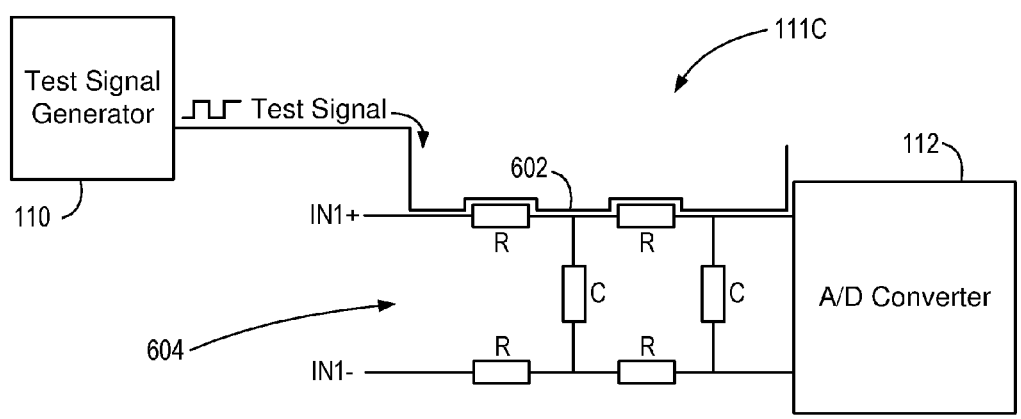
FIG. 6 is a simplified schematic view of signal injection circuitry according to some embodiments.

FIG. 6 is a simplified schematic view of signal injection circuitry 111C according to some embodiments. A/D converters often have a front-end RC filter prior to an input of the A/D converter. The signal injection circuitry 111C includes an A/D converter 112 and a front-end RC filter 604 prior to an input of the A/D converter 112. The signal injection circuitry 111C also includes an injection trace 602 that runs alongside the front-end RC filter 604, as shown in FIG. 6. Crosstalk occurs between the injection trace 602 and the front-end RC filter 604, injecting an injected signal into the front-end RC filter 604 responsive to the tone injection trace 602 conducting a test signal from a test signal generator 110.

Figure 7:
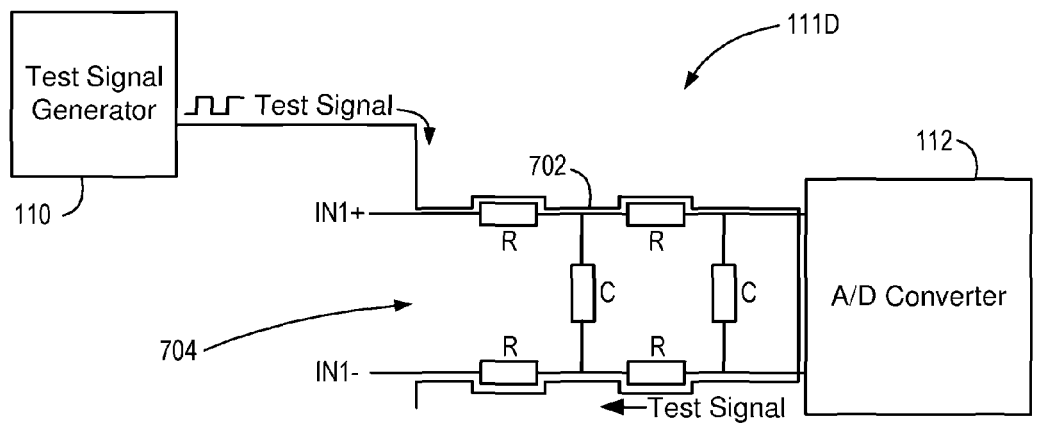
FIG. 7 is a simplified schematic view of signal injection circuitry according to some embodiments.

FIG. 7 is a simplified schematic view of signal injection circuitry 111D according to some embodiments. The signal injection circuitry 111D includes an A/D converter 112 and a front-end RC filter 704 prior to an input of the A/D converter 112. The signal injection circuitry 111D also includes an injection trace 702 that runs alongside the front-end RC filter 704, as shown in FIG. 7. To increase crosstalk effectiveness, the injection trace 702 is run close to both positive and negative inputs of the A/D converter 112, but in opposite directions, as shown in FIG. 7. The IN1+ input would experience an opposite polarity injected signal compared to the IN1− input. This may effectively double the crosstalk effectiveness of injected signals responsive to the test signal from the test signal generator 110.

Figure 8:
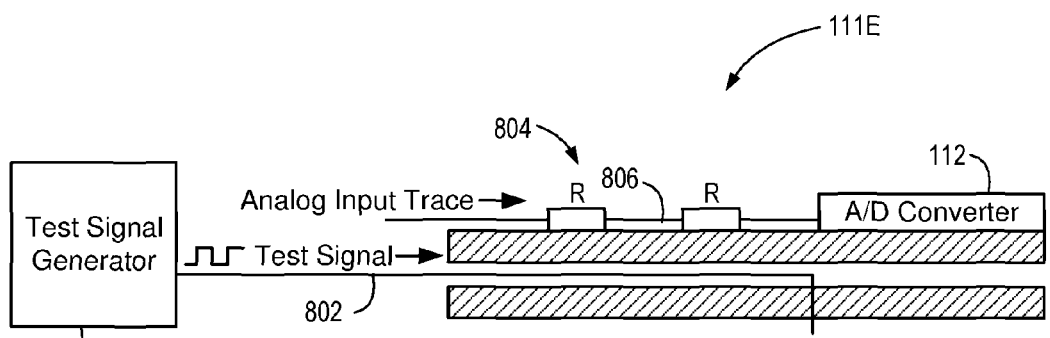
FIG. 8 is a simplified cross-sectional view of signal injection circuitry according to some embodiments.

FIG. 8 is a simplified cross-sectional view of signal injection circuitry 111E according to some embodiments. The signal injection circuitry 111E includes an A/D converter 112 and a front-end RC filter 804 prior to an input of the A/D converter 112. The signal injection circuitry 111E also includes a signal injection trace 802 and an analog input trace 806. The signal injection trace 802 and the analog input trace 806 do not necessarily need to be run side-by-side on the same layer (e.g., of a PCB) to experience crosstalk. Depending on the board stackup, it may be possible and advantageous to run the injection trace 802 above or below the analog input trace 806, as shown in FIG. 8.

Referring to FIGS. 5-8 together, A mutual inductance $L_m$ will inject a voltage noise $V_{noise}$ onto a victim trace proportional to the rate of change of current on the aggressor trace $I_{driver}$:

$$V_{noise} = L_m \frac{dI_{driver}}{dt}.$$

To obtain $V_{noise}$ using this equation, the mutual inductance $L_m$ should be determined.

Figure 9:
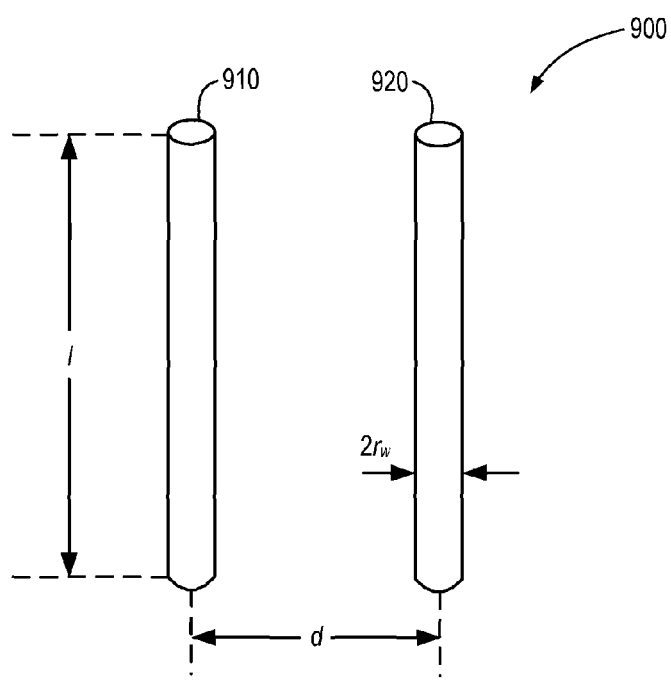
FIG. 9 illustrates a simplified geometry for calculating mutual inductance between parallel wires.

FIG. 9 illustrates a simplified geometry 900 for calculating mutual inductance $L_m$ between parallel wires 910, 920. The partial mutual inductance $L_m$ for two parallel wires as shown in FIG. 9 may be determined as:

$$L_m = \frac{\mu_0}{2\pi} l \left[ \ln\left(\frac{1}{d+r_\omega} + \sqrt{\left(\frac{1}{d+r_\omega}\right)^2 + 1}\right) - \sqrt{1 + \left(\frac{d+r_\omega}{l}\right)^2} + \frac{d+r_\omega}{l} \right],$$

where $\mu_0$ is the permeability of free space (having an expected value of $\mu_0 = 4\pi \times 10^{-7}$), l is a length over which the wires 910, 920 are parallel with each other, d is a distance between the wires 910, 920, and $r_w$ is a radius of the wires 910, 920. The model illustrated in FIG. 9 may be used to estimate mutual inductance $L_m$ between traces in the signal injection circuitry 111B, 111C, 111D, and 111E, which in turn may be used to estimate $V_{noise}$, as discussed above.

Figure 10:
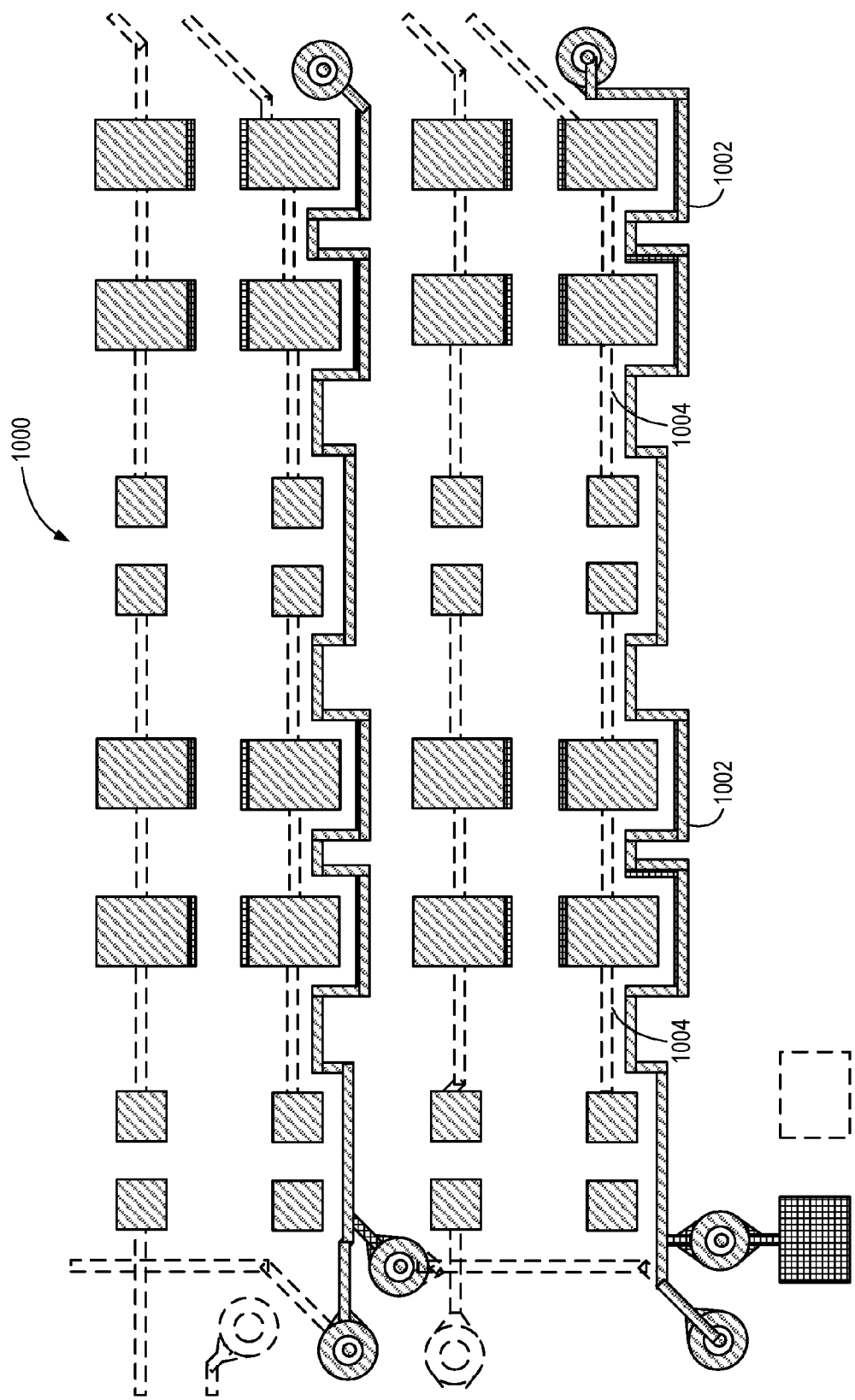
FIG. 10 shows is an example of a PCB layout implementing injection circuitry of FIG. 1 and FIG. 6.

FIG. 10 shows is an example of a PCB layout 1000 implementing injection circuitry 111 (FIG. 1). The PCB layout 1000 includes an injection trace 1002 laid out next to an analog victim trace 1004. The injection trace 1002 is approximately 5 mils away from the analog victim trace 1004 running across a length of about 1.25 mm. The complex geometry of the injection trace 1002 and the analog victim trace 1004 is simplified as shown in FIG. 11 to enable mutual inductance $L_m$ and voltage noise $V_{noise}$ to be estimated as discussed above.

Figure 11:
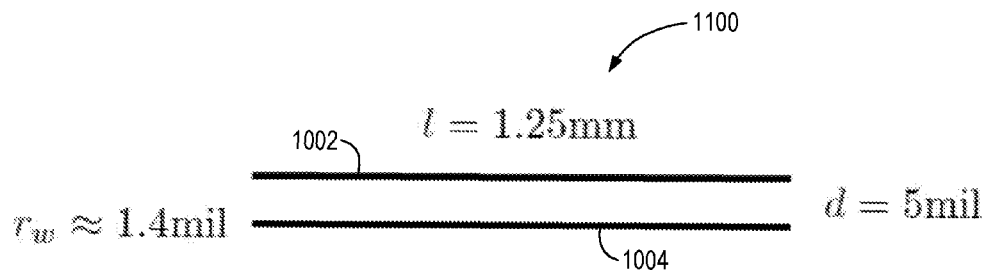
FIG. 11 illustrates a simplified geometry of an injection trace and an analog victim trace of FIG. 10.

FIG. 11 illustrates a simplified geometry of the injection trace 1002 and the analog victim trace 1004 of FIG. 10. With an equivalent value of $r_w$=1.4 mils, l=1.25 millimeters (mm), and d=5 mils, $L_m$ is about 2.9 nanoHenrys (nH) of mutual inductance.

As mentioned previously, noise induced in a victim trace through a mutual inductance is proportional to the rate of change of current in the aggressor trace. Thus, to achieve a good signal injection, fast current changes are desirable. One possible load configuration is using a load resistor. By way of non-limiting example, a test signal including a square wave may be provided by a voltage source (e.g., the test signal generator 110 of FIGS. 1 and 4-8) towards a resistive load (e.g., a 499Ω resistor). The resulting waveforms of a driving voltage, a resistor current, a derivative of the resistor current, and a coupled voltage (assuming the simplified geometry of FIG. 11) are shown in FIGS. 12-15.

Figure 12:
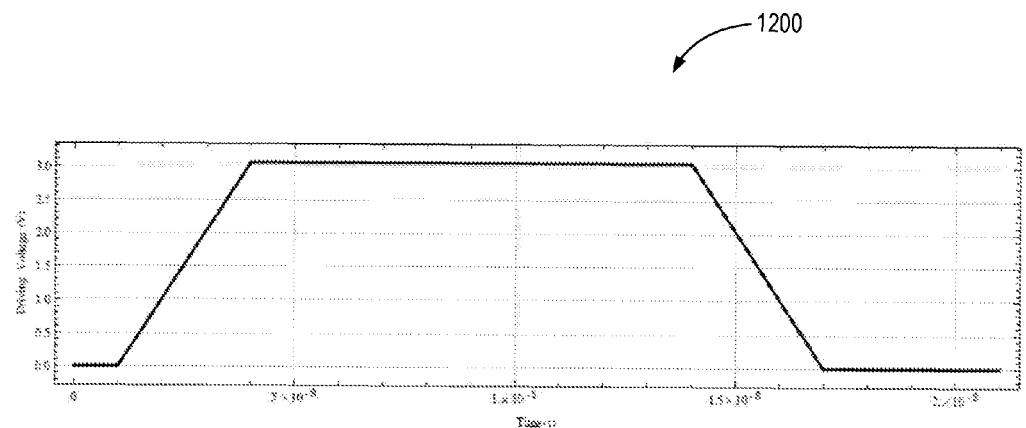
FIG. 12 is a waveform of a driving voltage produced by a test signal generator.

FIG. 12 is a waveform of a driving voltage 1200 produced by a test signal generator 110. As seen in FIG. 12, the driving voltage 1200, a rise time and a fall time of the driving voltage 1200 is about three (3) nanoseconds for a rise and a fall of about three (3) volts.

Figure 13:
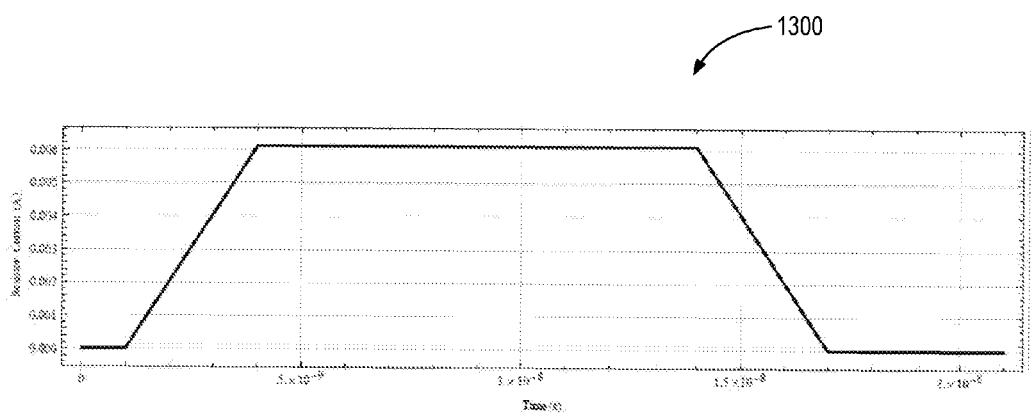
FIG. 13 is a waveform of a resistor current responsive to the driving voltage of FIG. 12.

FIG. 13 is a waveform of a resistor current 1300 of the 499Ω resistor, responsive to the driving voltage 1200 of FIG. 12. As seen in FIG. 13, the resistor current 1300 rises and falls about six (6) milliamps (mA) with the rise and fall of the driving voltage 1200.

Figure 14:
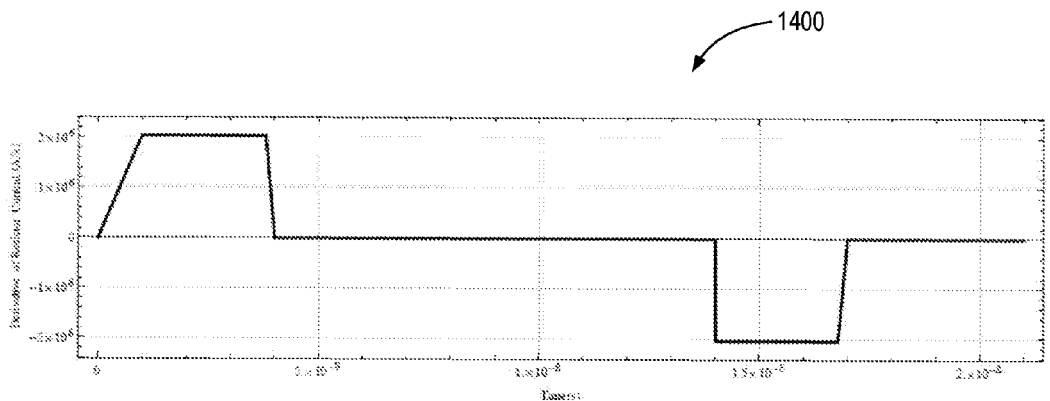
FIG. 14 is a waveform of a derivative of the resistor current of FIG. 13.

FIG. 14 is a waveform of a derivative 1400 of the resistor current 1300 of FIG. 13. As shown in FIG. 14, the derivative 1400 is positive during the rise time of the resistor current 1300 of FIG. 13.

Figure 15:
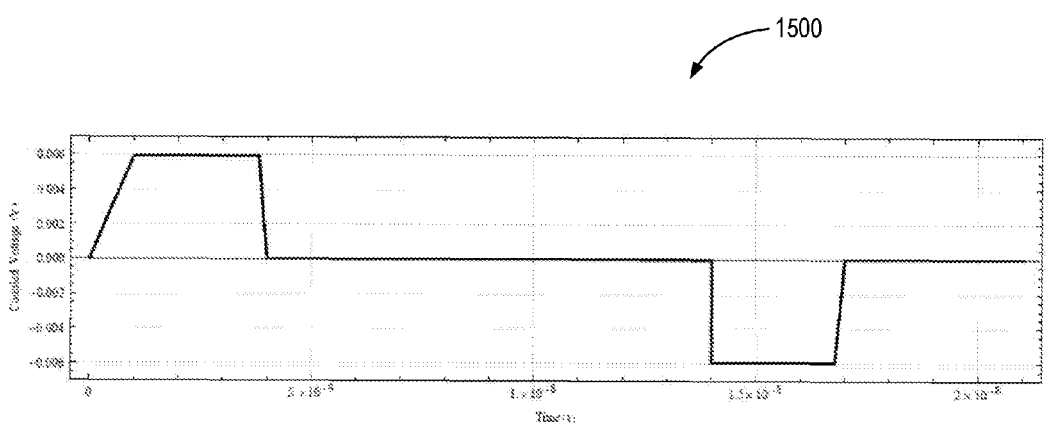
FIG. 15 is a waveform of a coupled voltage.

FIG. 15 is a waveform of a coupled voltage 1500 (e.g., an injected signal injected by the signal injection circuitry 111 of FIG. 1 using the simplified geometry discussed with reference to FIG. 11). The induced voltage for a 2.9 nH mutual inductance is about 6 mV. Relative to a 2.048V reference, this is about −50 dB. Accordingly, it would be expected that the output of an A/D converter 112 would indicate pulses of about 6 mV of injected crosstalk. If the injected crosstalk is not indicated at the output of the A/D converter 112, it may be determined that the A/D converter 112 is faulty.

Referring once again to FIG. 11, another non-limiting example may involve replacing the 499Ω resistive load with a 10 picoFarad (pF) capacitor. Resulting waveforms 1600, 1700, 1800, 1900 shown in FIGS. 16-19 show a ten-fold increase in induced voltage, producing about a 60 mV peak (−30 dB relative to a 2.048 V reference). To produce similar results with a resistive load, significant DC power would be used.

Figure 16:
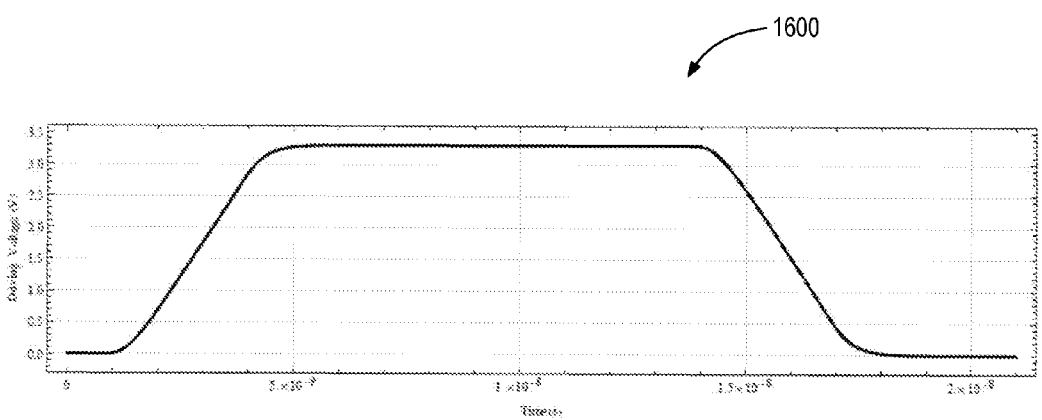
FIG. 16 is a waveform of a driving voltage produced by a test signal generator.

FIG. 16 is a waveform of a driving voltage 1600 produced by a test signal generator 110.

Figure 17:
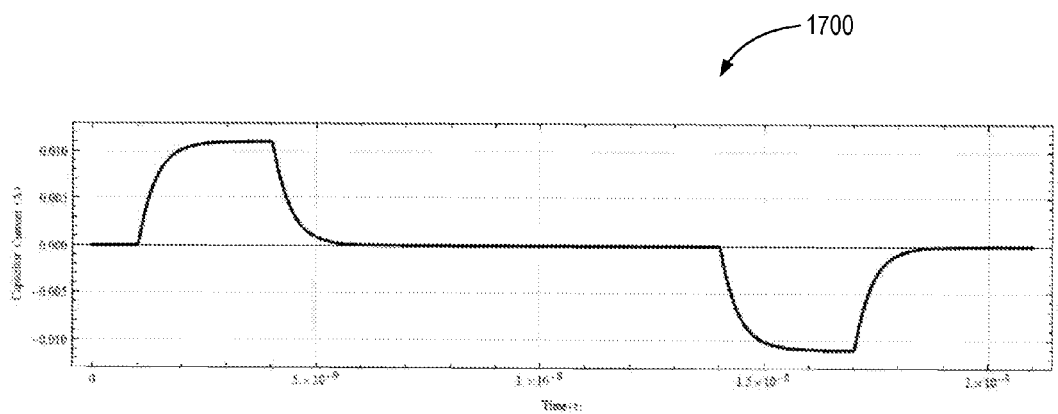
FIG. 17 is a waveform of a capacitor current responsive to the driving voltage.

FIG. 17 is a waveform of a capacitor current 1700 of the 10 pF capacitor, responsive to the driving voltage 1600.

Figure 18:
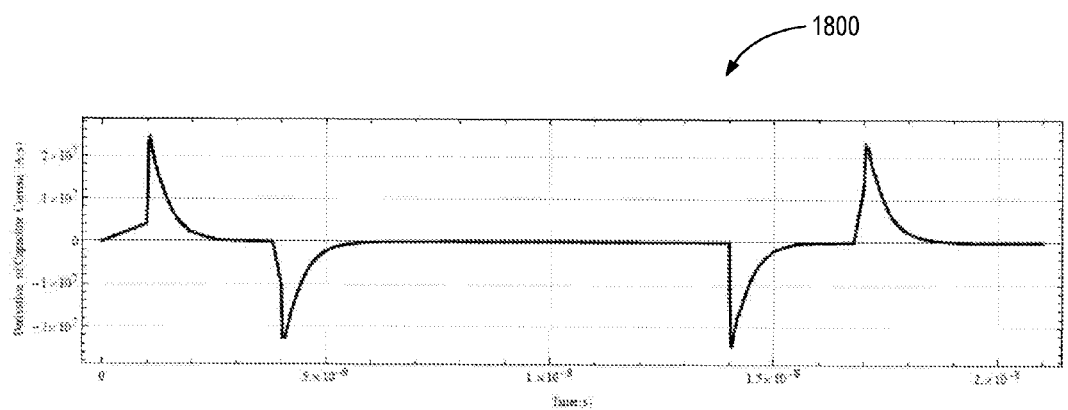
FIG. 18 is a waveform of a derivative of the capacitor current of FIG. 17.

FIG. 18 is a waveform of a derivative of the capacitor current 1700 of FIG. 17.

Figure 19:
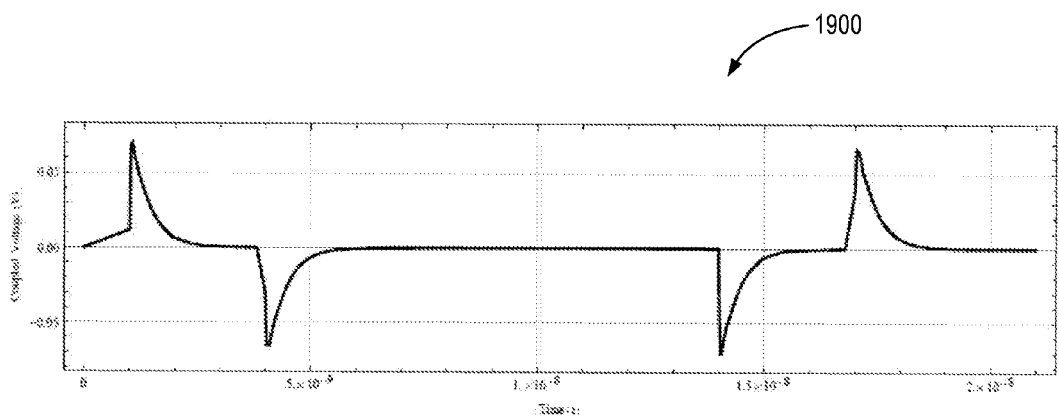
FIG. 19 is a waveform of a coupled voltage.

FIG. 19 is a waveform of a coupled voltage 1900 (e.g., an injected signal injected by the signal injection circuitry 111 of FIG. 1 using the simplified geometry discussed with reference to FIG. 11). The induced voltage for a 2.9 nH mutual inductance is about 60 mV. A capacitive load may be desirable because it expends less DC power and provides a virtual short circuit responsive to rising and falling edges of the square wave, consequently increasing a change in current with respect to time $$\left(\frac{dI}{dt}\right).$$

This increased change in current with respect to time is proportionally injected into the victim trace 1004 (FIGS. 10 and 11).

Delta-sigma A/D converters are over-sampling data converters which sample at rates much higher than the output data rate. The traditional downsampling filter for a delta-sigma A/D converter is a Sinc-shaped or CIC filter. This family of digital filters contains zeros (notches or nulls) at the output data rate and integer multiples thereof.

In some embodiments, such filtering may be used. If the modulated output of a delta-sigma A/D converter is available, it may be advantageous to inject the injected signal at a frequency equal to the output data rate or an integer multiple of the output data rate. The modulated data can be captured by an FPGA or other computing device and routed through two separate processing paths (i.e., through a main sinc filter 2015 and a test sinc filter 2016), as shown in FIG. 20.

Figure 20:
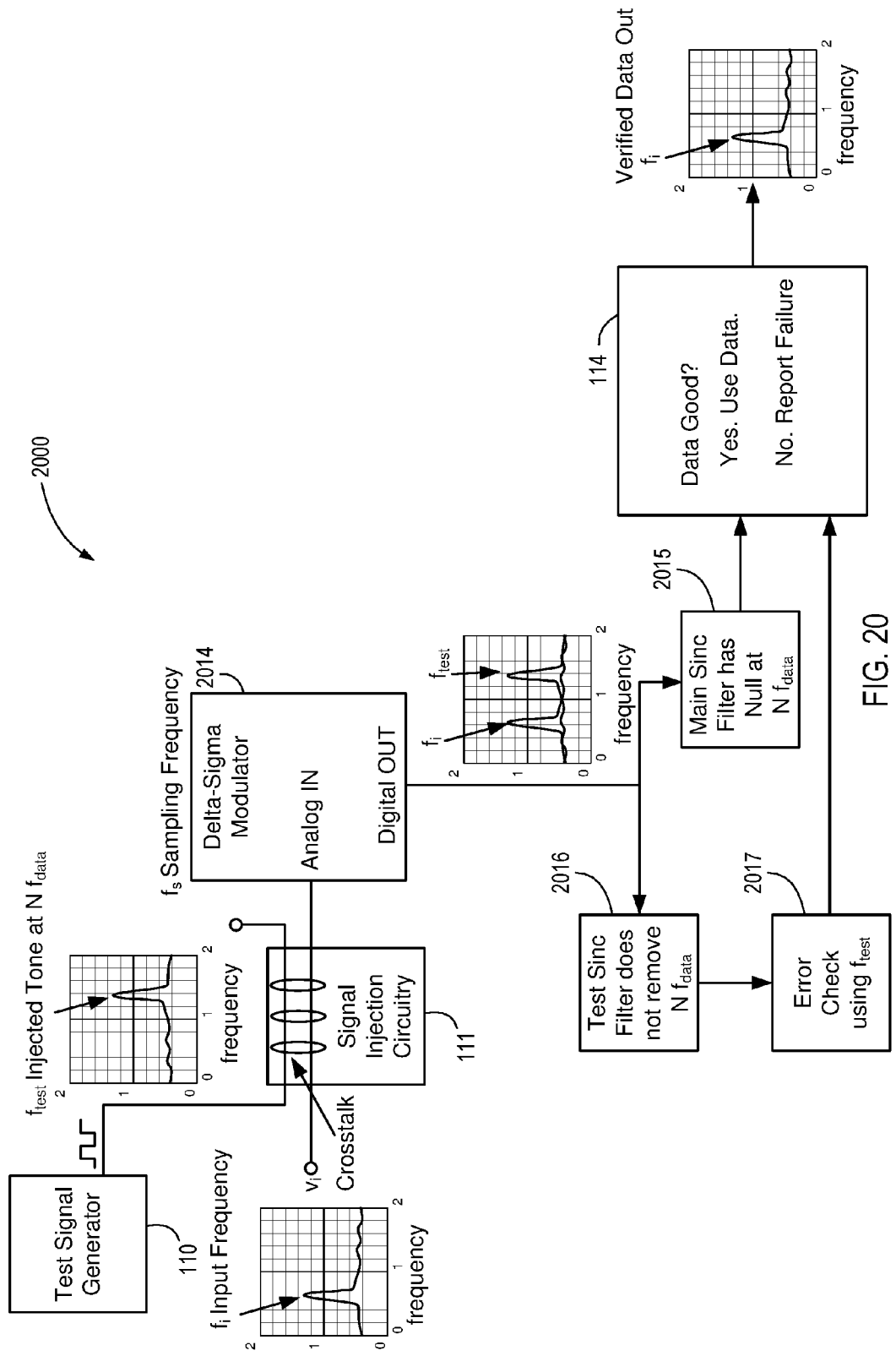
FIG. 20 is a simplified block diagram of a system for detecting a failure of an A/D converter, according to some embodiments.

FIG. 20 is a simplified block diagram of a system 2000 for detecting a failure of a delta-sigma A/D converter 2014, according to some embodiments. The system 2000 includes a test generator 110, signal injection circuitry 111, and an IED 114, as similarly discussed with reference to FIG. 1. An output of the delta-sigma A/D converter 2014 is, however, operably coupled to a main Sinc filter 2015 and a test Sinc filter 2016. The test Sinc filter 2016 is followed by an error check module 2017. Accordingly, the output of the A/D converter 2014 is delivered to two separate paths: a main data path through the main Sinc filter 2015 and a test data path through the test Sinc filter 2016.

Figure 21:
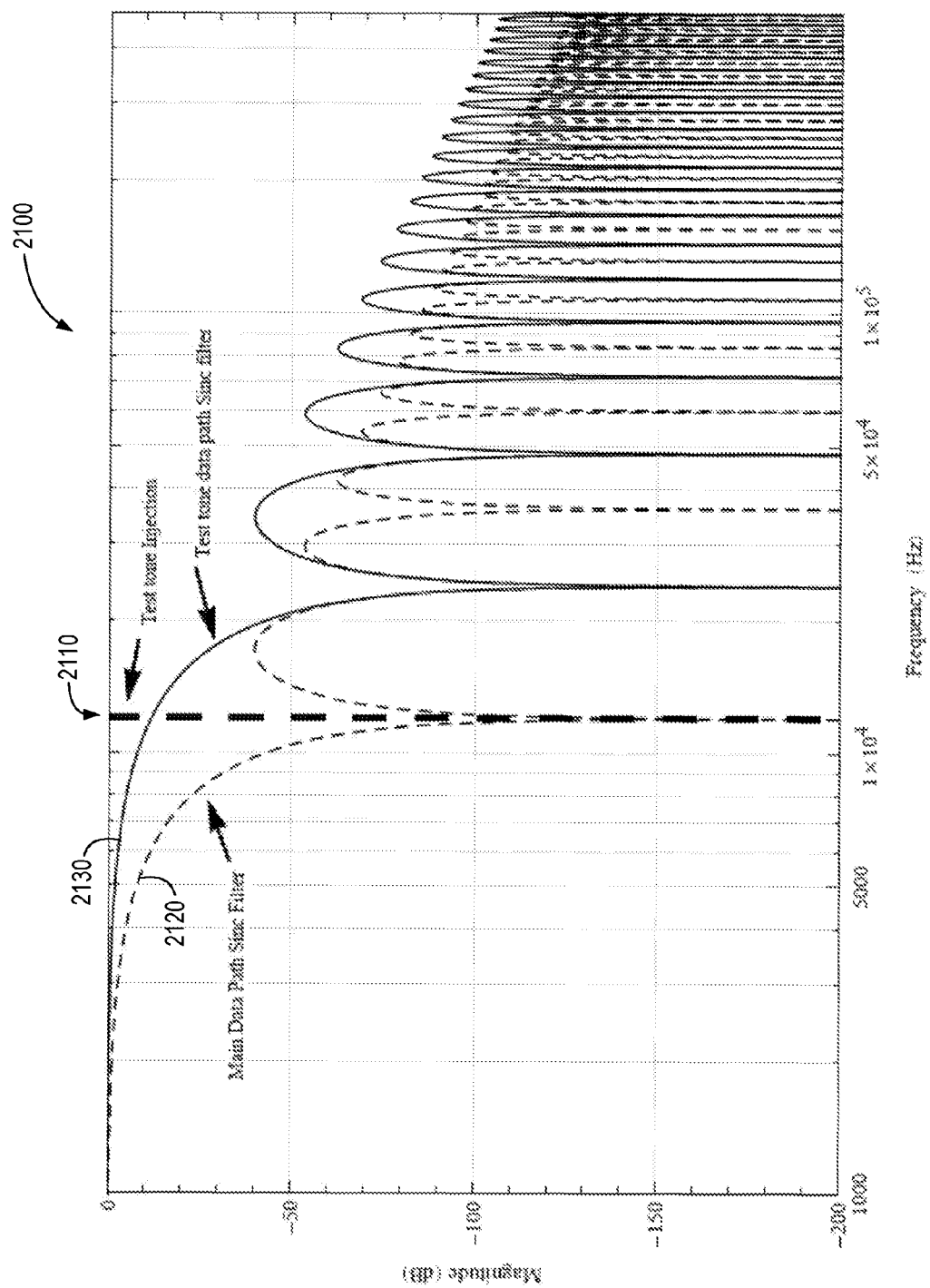
FIG. 21 is a plot illustrating a test tone injection frequency, a main data path Sinc filter response, and a test tone data path Sinc filter response.

FIG. 21 is a plot 2100 illustrating a test tone injection frequency 2110 (e.g., from an injected signal injected by the signal injection circuitry 111 of FIG. 20), a main data path Sinc filter response 2120, and a test tone data path Sinc filter response 2130. Referring to FIGS. 20 and 21 together, the main data path Sinc filter response 2120 may be a response of the main Sinc filter 2015. Also, the test tone data path Sinc filter response 2130 may be a response to the test Sinc filter 2016. The test data path can use a Sinc-shaped filter with an over-sample ratio (OSR) different than the main data path's OSR, as shown in FIG. 21. As shown in FIG. 21, the main Sinc filter 2015 can be designed so that the test tone lies within a "notch" and is substantially completely rejected. The test Sinc filter 2016 may use a different OSR such that the test-tone is measurable for verification. Using this method, the injected signal (e.g., a test tone) can be at least substantially perfectly rejected in the main data path since Sinc filters have infinite attenuation at multiples of the output data rate. The test-tone is, however, measurable in the test path to verify proper delta-sigma A/D converter 2014 operation.

In some embodiments, the injection trace may be used to inject multiple frequencies simultaneously. This can be produced with simple logic in an FPGA, for example. Multiple frequencies allow for A/D converter 112 operation to be verified in the presence of potentially disruptive external frequency injections. For example, a test tone of an injected signal may be set at 5 kHz. This, incidentally, coincides with the Electrical Fast Transient Burst type test injection frequency. It is possible that such a test may disrupt an ability to properly measure the A/D converter test tone and cause a false A/D converter 112 failure. Care should be taken when selecting the injected tone frequency.

Multiple test tones may alleviate this problem by continually injecting and checking multiple frequencies. By way of non-limiting example, if a type test interferes with one frequency in the test tone injection signature, a failure may not be declared. If more than one frequency in the test tone injection signature changes characteristics significantly, then this may be indicative of an A/D converter system failure and a failure may be declared.

Figure 22:
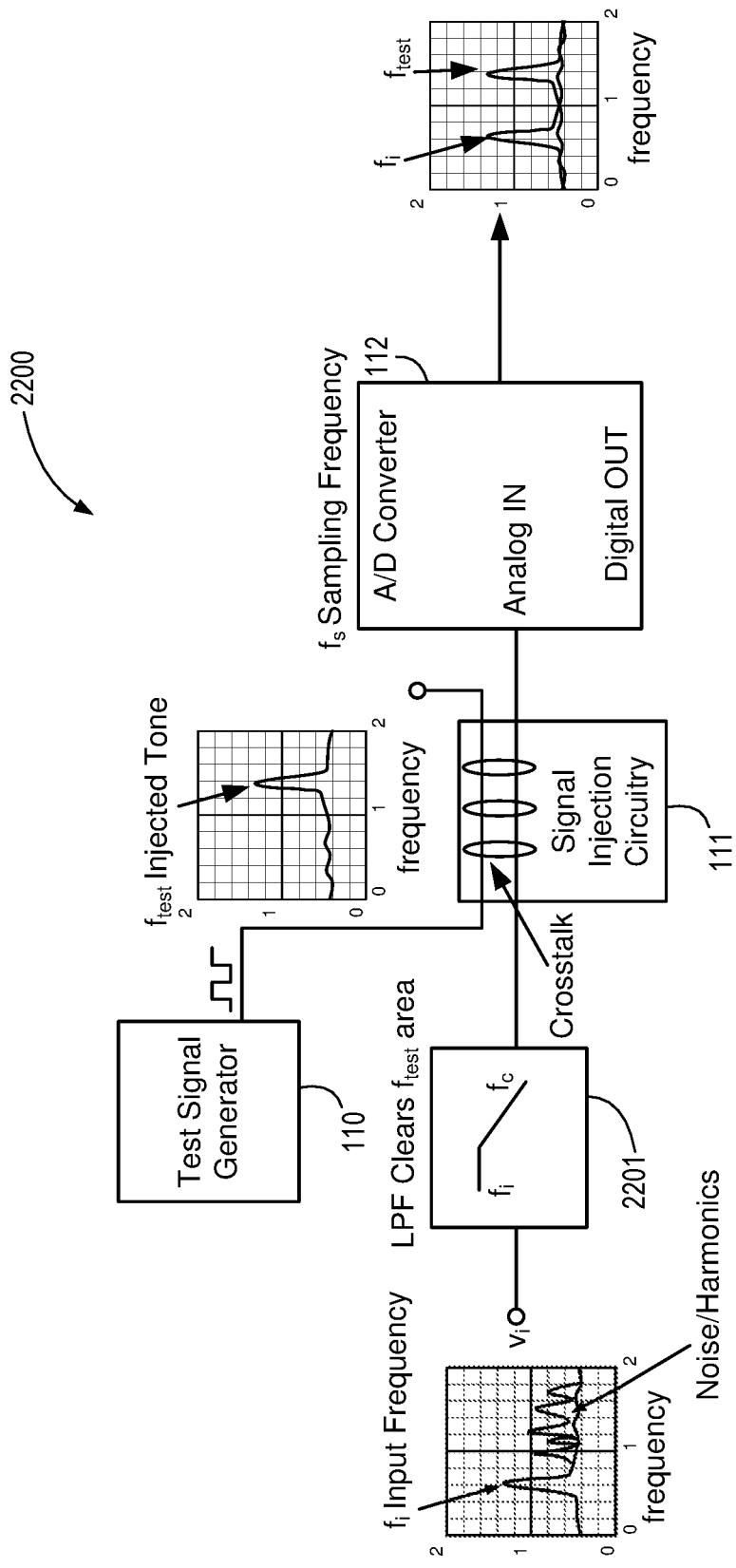
FIG. 22 is a simplified block diagram of a system for detecting a failure of an A/D converter, according to some embodiments.

FIG. 22 is a simplified block diagram of a system 2200 for detecting a failure of an A/D converter 112, according to some embodiments. The system 2200 includes a filter 2201 electrically connected in series with an input of an A/D converter 112, according to some embodiments. The filter 2201 in series with the input of the A/D converter 112 may be an analog filter. The filter 2201 may function as an anti-aliasing filter and/or a low-pass filter on the input of the A/D converter 112. The output of the A/D converter 112 may include one or more new injected frequency domain characteristics (e.g., a single frequency tone) injected using signal detection circuitry 111, which may be represented in one or more output voltages of the A/D converter 112.

The filter 2201 filters noise that may be carried by analog signal $v_i$. This noise may interfere with the injected signal. The noise may not likely be caused by quantization noise or other digital errors, and such errors may not be removed by the filter 2201. By using a low pass filter prior to the signal injection circuitry 111, the way may be cleared to for the injected signal to be injected without interfering noise that may disrupt checking for faults of the A/D converter 112.

One or more filters may be associated with the A/D converter 112 (e.g., as digital functions implemented by an IED) and may be configured to remove quantization errors present in the digital data stream output by a modulator of the A/D converter 112. The filter 2201 may further be configured to remove other kinds of noise from the digital data stream output by a modulator, or to function as an anti-aliasing filter on the input of the A/D converter 112. A modulator of an A/D converter 112 may incorporate quantization error, quantization noise, and other common kinds of noise into the output digital data stream. The noise and/or errors present in the digital data stream output by a modulator may exist at frequencies centered around a sampling frequency of the A/D converter 112. However, the frequency of the information of interest present in the digital data stream may be centered at a smaller frequency than the sampling frequency of the A/D converter 112. More than one filter may be associated with the A/D converter 112 to facilitate removal and/or attenuation of one or more noise elements without removing or attenuating a portion of the digital data stream containing some or all of the information of interest.

The filter 2201 associated with the A/D conversion system 2200 may be implemented as either a digital function or as analog circuitry. A filter may be an analog low-pass filter according to a Sallen-Key filter topology, or may be a low-pass filter implemented as a digital function (e.g., by an IED). However, a filter associated with the A/D conversion system 2200 (e.g., a filter electrically connected in series to the input of an amplifier module) may be any suitable filter, and may be configured according to any suitable filter configuration.

The filter(s) associated with the A/D conversion system 2200 may have any suitable step or impulse response. Many different types of filter topologies may be associated with the A/D conversion system 2200. For example, the filter may be a sinc filter, a high-pass filter, a low-pass filter, a sinc in time filter, a sinc in frequency filter, a band pass filter, a notch filter, a comb filter, or any other suitable kind of filter. For example, the features of a filter may facilitate detection of one or more failures of the A/D converter 112. Using a low pass filter (LPF) 2201 before the signal injection allows any noise injected into the signal path near the test signal ($f_{test}$) to be filtered out, ensuring the test signal is a valid measurement of data acquisition system integrity.

Figure 23A:
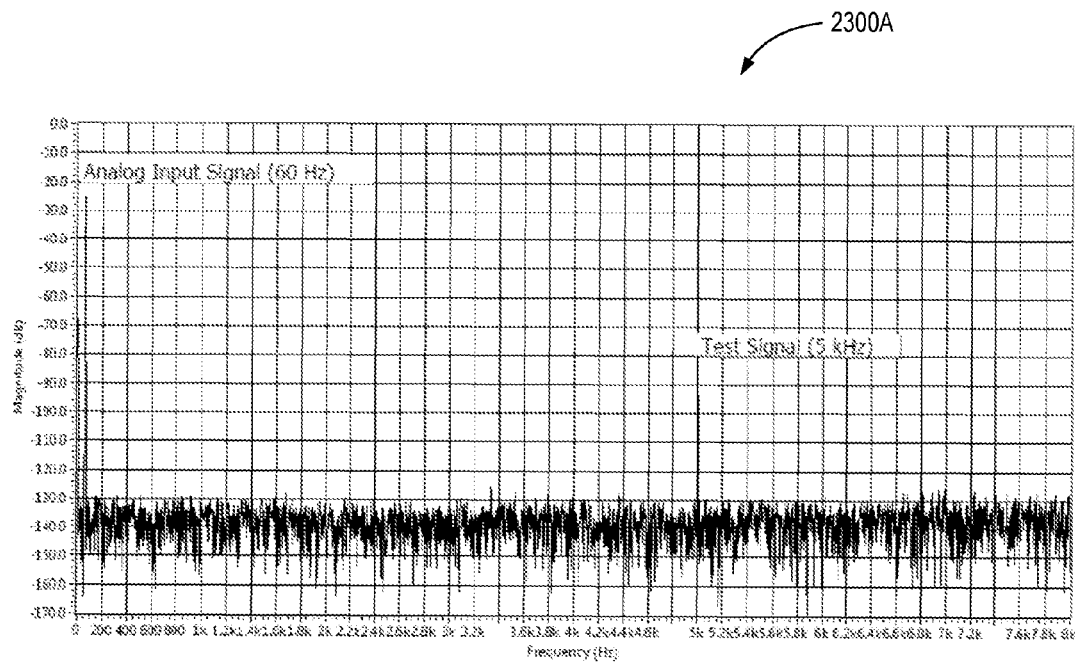
FIG. 23A is a plot of a fast Fourier transform (FFT) of an output of an A/D converter with 10,000 samples at 16 kHz.
Figure 23B:
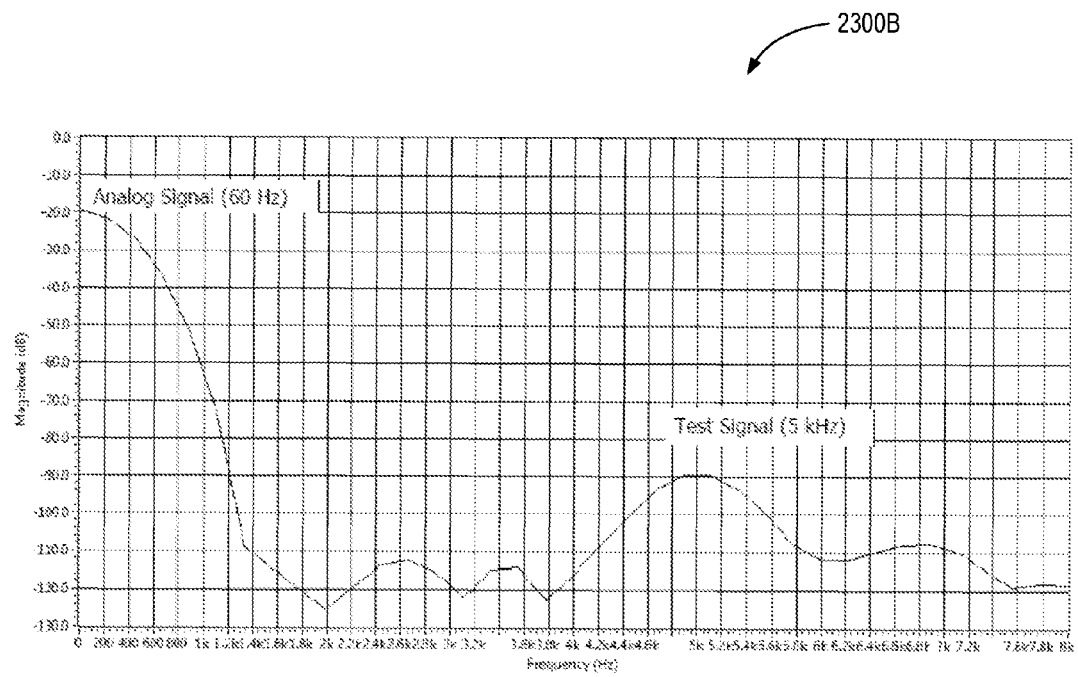
FIG. 23B is a plot of a fast Fourier transform (FFT) of the output of an A/D converter with only 72 samples at 16 kHz (4.5 ms of data).

FIGS. 23A and 23B illustrate plots of results of an experimental test of signal injection, as disclosed herein. A circuit board of an A/D converter data acquisition system was used for the experiment. In the experiment, function generator was used to generate a test signal of 3.3 V, 5 kHz, which was conducted through a lead of a 499Ω resistor glued on top of a CH1+ trace of the circuit board. An analog signal was applied to the CH1 trace, which was input to an A/D converter.

FIG. 23A is a plot 2300A of a fast Fourier transform (FFT) of an output of the A/D converter 112 with 10,000 samples at 16 kHz. Peaks corresponding to the analog input signal and the test signal can be clearly seen. As shown, the harmonics of the test signal do not alias back into the critical frequency range. This is because the A/D converter has an internal Sinc filter that provides attenuation for high-frequency signals. Since the fundamental frequency of the test tone is at about −90 dB, the harmonics do not require much attenuation for them to fall below the noise floor.

FIG. 23B is a plot 2300B of a fast Fourier transform (FFT) of the output of the A/D converter with only 72 samples at 16 kHz (4.5 ms of data). In implementation, the latency that occurs between when an A/D converter system fails and when the failure can be detected is important. As shown in FIG. 25B, with only 72 samples at 16 kHz (4.5 ms of data), the analog signal and the test signal are still clearly visible. With higher sampling rates and test signal frequencies, the A/D converter health can be evaluated at a rate faster or equal to the protection decision rate. This may enable detection of a failure before the data is used for protection decisions.

Figure 24:
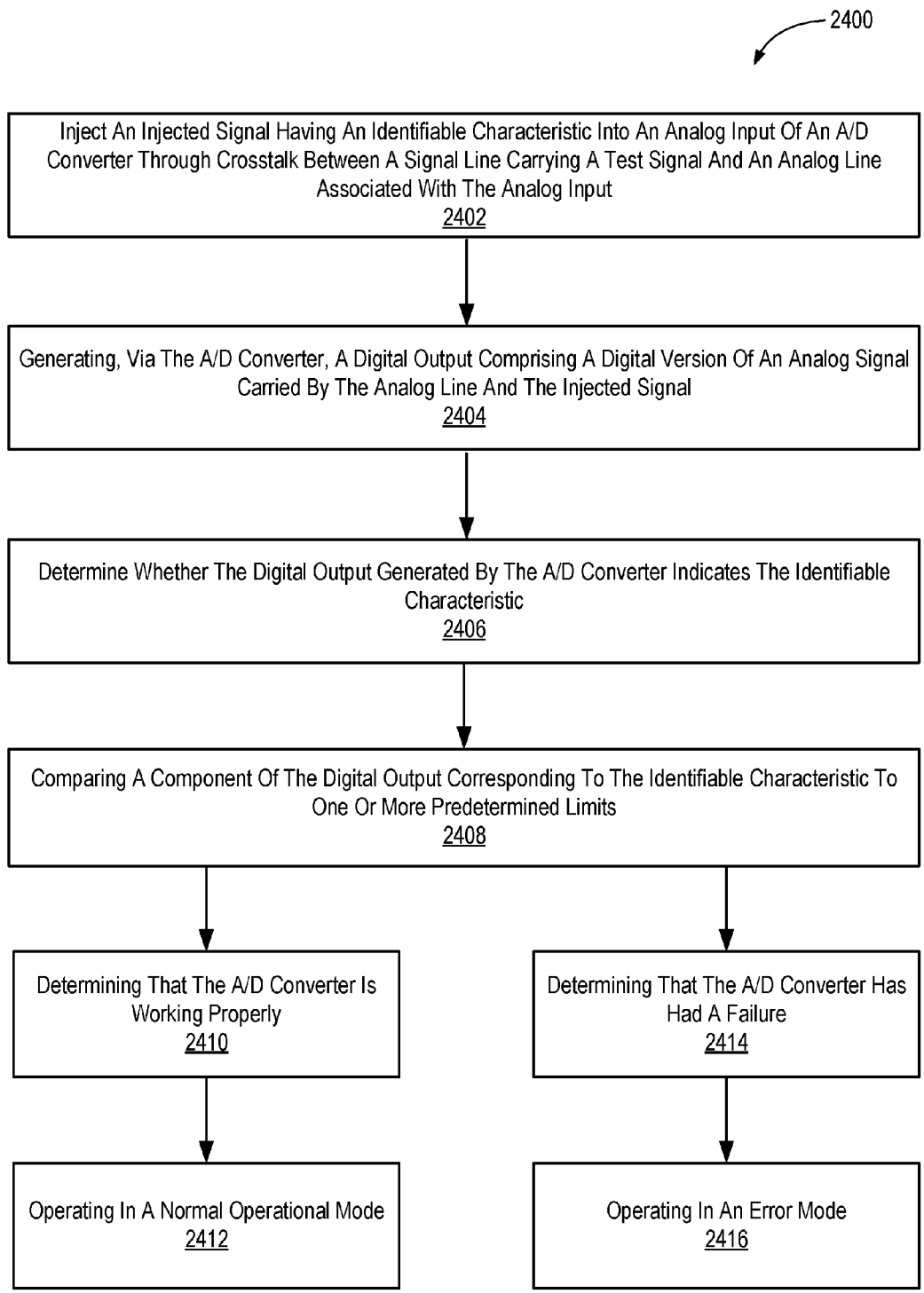
FIG. 24 is a simplified flowchart illustrating a method for detecting a failure of an A/D converter, according to some embodiments.

FIG. 24 is a simplified flowchart illustrating a method 2400 for detecting a failure of an A/D converter 112, according to some embodiments. Referring to FIGS. 1 and 24 together, the method 2400, according to some embodiments, may be implemented on a computing device. The method 2400 may include injecting 2402 an injected signal having an identifiable characteristic into an analog input of the A/D converter 112 through crosstalk between a signal line carrying a test signal and an analog line associated with the analog input. A computing device may be configured to inject the injected signal using a test signal generator 110 configured to generate the test signal. In some embodiments, the test signal line may be terminated by a resistive load, a capacitive load, any other suitable load, or combinations thereof. In some embodiments, injecting 2402 the injected signal having an identifiable characteristic includes injecting the injected signal having one or more test tone frequencies.

The method 2400 also includes generating 2404, via the A/D converter 112, a digital output including a digital version of the analog signal carried by the analog line and the injected signal. For example, generating 2404 a digital output includes converting signals received at the input of the A/D converter to a digital version of the signals. A computing device may be configured to store data corresponding to the digitized version of the analog signal and the injected signal.

An output of the A/D converter may be in electrical communication with a computing device. The A/D converter output may be configured to couple with a computing device through one or more suitable indirect means of electrical coupling. The determined plurality of consecutive instantaneous voltages may be output voltage values of one or more A/D converter outputs.

The method may also include determining 2406 whether the digital output generated by the A/D converter 112 indicates the identifiable characteristic. By way of non-limiting example, a computing device may have data corresponding to the identifiable characteristic (e.g., properties of the injected signal responsive to certain test signals are previously known or determinable by the computing device). Also by way of non-limiting example, a computing device may include a meter configured to detect the identifiable characteristic at the input of the A/D converter. In some embodiments, a computing device may include a comparator configured to compare a known (e.g., measured, predicted, etc.) identifiable characteristic to the digital output to determine if the known identifiable characteristic is present in the digital output.

A computing device may then take any action appropriate (e.g., trigger alarms, break electrical connections between circuits, transmit communications notifying operators of a power system, continue normal operation, etc.) responsive to the determination of whether the digital output indicates the identifiable characteristic.

For example, the method 2400 may include comparing 2408 a component of the digital output corresponding to the identifiable characteristic to one or more predetermined limits. If the component of the digital output corresponding to the identifiable characteristic is within the predetermined limits (e.g., limits in magnitude, phase, frequency, etc.), it may be determined 2410 that the A/D converter is working properly, and the computing device may operate 2412 in a normal operational mode (e.g., relying on a digital conversion provided by the A/D converter as a correct conversion). If, however, the component of the digital output corresponding to the identifiable characteristic is not within the predetermined limits, it may be determined 2414 that the A/D converter has had a failure, and the computing device may operate 2416 in an error mode (e.g., breakers may be opened, a failure may be flagged, a failure may be reported, an alarm may sound, etc.).

Figure 25:
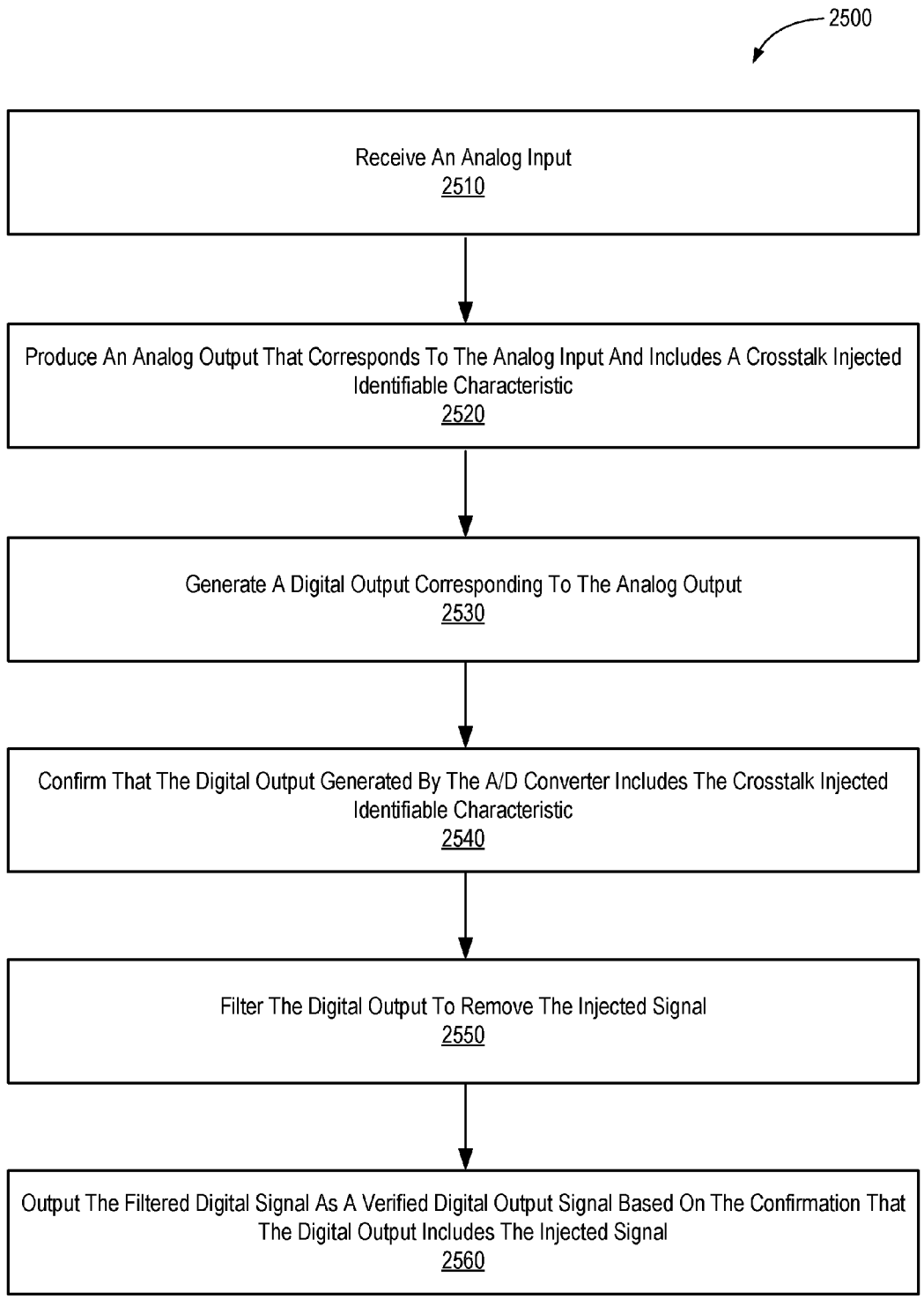
FIG. 25 is a simplified flowchart illustrating a method for verifying a digital output of an A/D converter, according to some embodiments.

FIG. 25 is a simplified flowchart illustrating a method 2500 for verifying a digital output of an A/D converter 112, according to some embodiments. Referring to FIGS. 1 and 25 together, injection circuitry 111 may receive 2510 an analog input. The injection circuitry 111 may produce 2520 an analog output that corresponds to the analog input and includes a crosstalk injected identifiable characteristic. In various embodiments, the injected identifiable characteristic may be associated with a test signal from a test signal generator 110 (FIG. 1). For example, the injected identifiable characteristic may be associated with one or more frequencies of a test signal from the test signal generator 110.

An A/D converter 112 may generate 2530 a digital output corresponding to the analog output. A verification module, potentially part of an IED 114, may confirm 2540 that the digital output generated by the A/D converter 112 includes the identifiable characteristic. In some embodiments, the output may be filtered regardless of the confirmation; in other embodiments, the output may only be filtered if the confirmation is successful. The filtering may be done in analog or digital. A filter may be used to filter 2550 the digital output to remove the injected signal. The filtered digital signal may be output 2560 as a verified digital output signal based on the confirmation that the digital output includes the injected signal.

Figure 26:
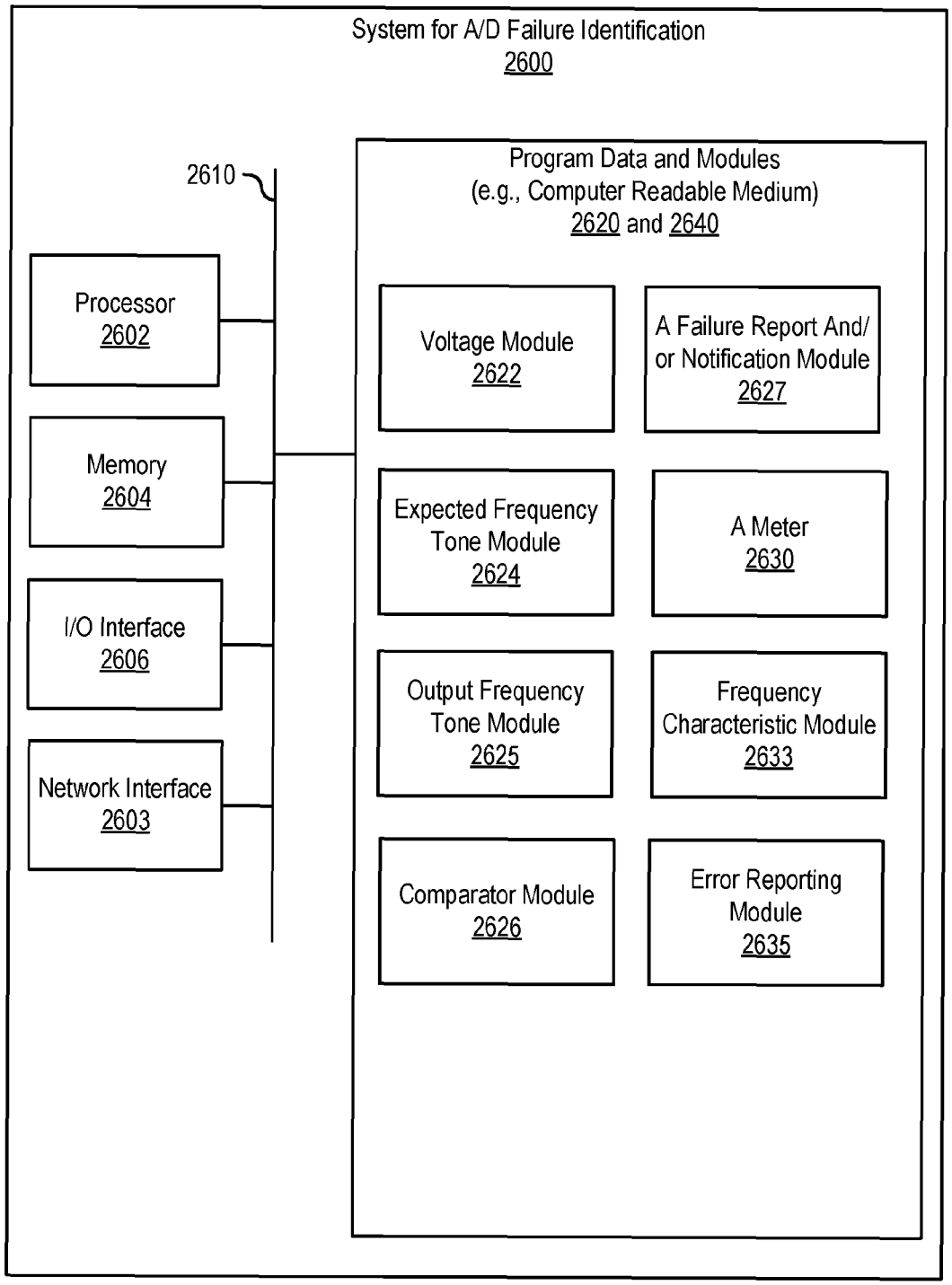
FIG. 26 is a system for identifying failures of an A/D converter, according to some embodiments.

FIG. 26 is a system 2600 for identifying failures of an A/D converter, according to some embodiments. A system for identifying failures of an A/D converter 2600 may include a system bus 2610, one or more processors 2602, a memory 2604, an input/output interface 2606, and a network interface 2603. The memory 2604 may be in electrical communication with the one or more processors 2602, via a system bus 2610, to store program data 2640.

The one or more processors 2602 may include one or more general purpose devices, such as an Intel®, AMD®, or other standard microprocessor. The one or more processors 2602 may include a special purpose processing device, such as ASIC, SoC, SiP, FPGA, PAL, PLA, FPLA, PLD, or other customized or programmable device. The one or more processors 2602 may perform distributed (e.g., parallel) processing to execute or otherwise implement functionalities of the present embodiments. The one or more processors 2602 may run a standard operating system and perform standard operating system functions. It is recognized that any standard operating system may be used, such as, for example, Microsoft® Windows®, Apple® MacOS®, Disk Operating System (DOS), UNIX, IRJX, Solaris, SunOS, FreeBSD, Linux®, QNX®, ffiM® OS/2® operating systems, and so forth.

The memory 2604 may include static RAM, dynamic RAM, flash memory, one or more flip-flops, ROM, CD-ROM, DVD, disk, tape, magnetic, optical, or other computer storage medium. The system bus 2610 may facilitate communication and/or interaction between the other components of the system, including the one or more processors 2602, the memory 2604, the input/output interface 2606, and the network interface 2603.

Program modules 2620 may include all or portions of other elements of the system 2600. The modules 2620 may run multiple operations concurrently or in parallel by or on the one or more processors 2602. Portions of the disclosed modules, components, and/or facilities are embodied as executable instructions embodied in hardware or firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. Portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

The system memory 2604 may also include program data 2640. Data generated by the system 2600, such as by the modules 2620, may be stored on the system memory 2604, for example, as stored program data 2640. The stored program data 2640 may be organized as one or more databases.

The input/output interface 2606 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network interface 2603 of the system 2600 may be configured to communicate over a communication network with one or more computing devices.

Program and/or module data 2620, 2640 may be received via the network interface 2603 over a network from an appropriate device, such as a computing device, an IED, or even a mobile computing device. The program data 2640 may be received as user input manually entered into a user interface of an appropriate IED or computing device. The program data 2640 may also be received from one or more A/D converters through the network interface 2603, or through the input/output interface 2606. The program data 2640 may be received automatically from a data management system on an IED or a computing device.

As noted, the system 2600 also includes various modules 2620 (or engines, elements, or components) to implement functionalities of the system 2600, including a voltage module 2622, an expected frequency tone module 2624, an output frequency tone module 2625, a comparator module 2626, and/or a failure report and/or notification module 2627. These elements may be embodied, for example, at least partially in the program modules 2620. In other embodiments, these elements may be embodied or otherwise implemented in hardware of the system 2600. The system 2600 may also include program data 2640 such as one or more voltage values, one or more of a first magnitude and/or a first frequency of a single frequency tone, one or more second magnitudes of a single frequency tone, one or more comparison outcomes, and/or one or more failure reports that may be stored in the memory 2604, which may be generated, accessed, and/or manipulated by the modules 2620.

The voltage module 2622 may be configured to determine a plurality of consecutive voltage values associated with an output of an A/D converter. The voltage module 2622 may be configured to store a plurality of consecutive voltage values in the program data 2640. Each of the voltage values of the voltage module 2622 may be based on an analog voltage input to the A/D converter, and each of the voltage values may include the time at which the voltage value was determined. The voltage module 2622 may be configured to determine a plurality of consecutive voltage values associated with an analog voltage of an output of an A/D converter that may couple with the system 2600 via the network interface 2603. In other embodiments, the voltage module 2622 may determine the plurality of voltage values associated with an analog voltage of an input of an A/D converter that may couple with the system 2600 via the input/output interface 2606. The system 2600 may be further configured to store a time at which each of the voltage values may have been determined by the voltage module 2622.

The expected frequency tone module 2624 may be configured to determine a first magnitude and a first frequency of a single frequency tone associated with an output of an A/D converter. First magnitudes and/or a first frequencies may be associated with a test signal from a test signal generator, and an expected injected signal injected into an input of the A/D converter through trace-to-trace crosstalk from a line carrying the test signal.

The output frequency tone module 2625 may be configured to determine one or more second magnitudes of frequencies of the output of each A/D converter. The second magnitudes may be determined according to any suitable method. For example, a fast Fourier transform operation may be performed on the plurality of consecutive voltage values with a corresponding frequency domain analysis of the resulting values.

The comparator module 2626 may compare the determined second magnitudes and the first magnitudes of the first and second A/D converters. The comparator module 2626 may identify a failure of the first and/or second A/D converters, if the determined second magnitudes of the first and second A/D converters are less than or greater than one or more identified first magnitudes. The determined second magnitudes may be greater than the first magnitudes of either the first or the second A/D converter. The comparator module 2626 may be configured to identify a non-failure, or may indicate that no failure of an A/D converter has been identified.

Based on an output of the comparator module 2626, the failure report and/or notification module 2627 may report a failure of an A/D converter. If a determined second magnitude is less than a first magnitude, the failure report module may be configured to report a failure of an A/D converter. For example, the comparator module 2626 may determine that determined second magnitudes are less than first magnitudes configured to be minimum magnitudes of the frequencies of the output of an A/D converter. The comparator module 2626 may identify a failure of the A/D converter, and the failure report module 2627 may report the failure according to any suitable method.

For example, the failure report module may be configured to report a failure of the A/D converter to a communication system coupled with the system 2600. The system 2600 may be configured to illuminate one or more warning lights, and may indicate a failure of an A/D converter with the one or more illuminated warning lights. The system 2600 may be configured to alter one or more processes, and/or configure one or more components of a power system coupled with the system 2600. However, the system 2600 may be configured to operate according to any suitable manner in response to one or more identified failures of an A/D converter. The failure report module 2627 may be configured to communicate a status of one or more A/D converters to a communication system coupled with the system 2600. The system 2600 may include one or more status lights to indicate when no failures have been detected in one or A/D converters configured to couple with the system 2600.

A meter module 2630 may be configured to identify a frequency characteristic injected into an input of an A/D converter by signal injection circuitry 111 using trace-to-trace crosstalk. The input to the signal injection circuitry 111 may comprise a frequency $f_a$, and the output of the signal injection circuitry may be $f_a+f_{test}$, where $f_{test}$ is the injected frequency characteristic.

The meter module 2630 may also obtain a measurement of an output of the A/D converter. A frequency characteristic module 2633 may determine that the frequency characteristic, $f_{test}$, is missing from the output of the A/D converter. Additionally, the frequency characteristic module 2633 may determine that the frequency characteristic, $f_{test}$, has changed frequency or magnitude in a manner indicative of an A/D and/or analog circuit failure. An error reporting module 2635 may report a failure of the A/D converter based on the determination that the frequency characteristic, $f_{test}$, is missing or otherwise different from the expected frequency characteristic as determined by the expected frequency tone module 2624.

This disclosure has been made with reference to various embodiments, including the best mode. However, those skilled in the art will recognize that changes and modifications may be made to the embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

What is claimed:

1. An analog to digital (A/D) conversion system with failure identification, comprising:
a test signal generator configured to generate a test signal including an identifiable characteristic;
an analog trace in electrical communication with an input of A/D converter and configured to carry an analog signal to the A/D converter;
the A/D converter in electrical communication with the analog trace, configured to convert the analog signal measured at an input of the A/D converter to a digital output;
a test signal trace in electrical communication with the test signal generator, the test signal trace in proximity to the analog trace, and configured to induce at least a portion of the test signal onto the analog trace by electromagnetic field interaction between the test signal trace and the analog trace; and
an intelligent electronic device (IED) configured to:
determine existence, non-existence, or variation of the identifiable characteristic in the digital output;
filter the digital output to remove the identifiable characteristic from the digital output; and
provide a failure notification based on a determination by the failure identification module that the identifiable characteristic does not exist in the digital output, or has changed in a manner indicative of an A/D failure and/or analog circuit failure.

2. The A/D conversion system of claim 1, wherein the test signal generator is configured to generate a test signal including a square wave.

3. The A/D conversion system of claim 1, wherein the test signal generator is configured to generate a test signal including a plurality of square waves of different fundamental frequencies.

4. The A/D conversion system of claim 1, wherein the identifiable characteristic includes a fundamental frequency of the test signal.

5. The A/D conversion system of claim 1, wherein the electromagnetic field interaction between the analog trace and the test signal trace comprises mutual inductance between the test signal trace carrying the test signal and the analog trace.

6. The A/D conversion system of claim 5, wherein the test signal trace is located alongside the analog trace within a same layer of a circuit board as the analog trace.

7. The A/D conversion system of claim 5, wherein the test signal trace is split into a plurality of branches of the test signal trace, each branch of the plurality of branches located proximate to the analog trace, one or more other analog traces, or combinations thereof.

8. The A/D conversion system of claim 5, wherein the test signal trace at least partially overlaps the analog trace in a different layer of a circuit board than the analog trace.

9. The A/D conversion system of claim 1, wherein electromagnetic field interaction between the analog trace and the test signal trace comprises electromagnetic field interaction between the test signal trace and a front-end resistor-capacitor (RC) filter at an input to the A/D converter.

10. The A/D conversion system of claim 9, wherein the test trace is located proximate at least two sides of the front-end RC filter to increase the mutual inductance between the test trace and components of the front-end RC filter.

11. The A/D conversion system of claim 1, wherein the electromagnetic field interaction comprises capacitive crosstalk between the test signal trace and the analog trace carrying the analog signal.

12. The A/D conversion system of claim 1, wherein the test signal trace is terminated with a resistive load.

13. The A/D conversion system of claim 1, wherein the test signal trace is terminated with a capacitive load.

14. The A/D conversion system of claim 1, further comprising a test filter and a main filter operably coupled to an output of the A/D converter, the test filter configured to pass the injected signal and the main filter configured to remove the injected signal.

15. The A/D conversion system of claim 14, wherein the IED is configured to determine the existence, non-existence, or variation of the identifiable characteristic by analyzing an output of the test filter.

16. The A/D conversion system of claim 1, further comprising a low pass filter operably coupled to an analog line configured to carry the analog signal to the input of the A/D converter, wherein:
the test signal trace is configured to induce the at least a portion of the test signal onto the analog trace by electromagnetic field interaction between the low pass filter and the input of the A/D converter; and
the low pass filter is configured to attenuate electrical oscillations that are near a fundamental frequency of the test signal and pass the analog signal.

17. An intelligent electronic device (IED) configured to identify a failure in an analog to digital (A/D) converter, comprising:
an analog trace in electrical communication with an input of the A/D converter and configured to carry an analog signal to the A/D converter;
and configured to inject a frequency characteristic into the analog trace by electromagnetic field interaction between the test signal trace and the analog trace;
a test signal trace in proximity to the analog trace, configured to inject one or more frequency characteristics into the analog trace by electromagnetic field interaction between the test signal trace and the analog trace at an input of an A/D converter wherein an analog signal carried to the input of the A/D converter comprises a frequency $f_a$, and the one or more frequency characteristics injected by the test signal trace comprise another frequency $f_{test}$, a superposition of the analog signal and the one or more frequency characteristics comprising $f_a+f_{test}$; and
a meter configured to obtain a measurement of an output of the A/D converter;
a frequency characteristic module configured to determine that the one or more frequency characteristic, $f_{test}$, is missing or exhibits significant variation from an expected behavior of the output of the A/D converter; and
an error reporting module configured to report a failure of the A/D converter based on the determination that the frequency characteristic, $f_{test}$, is missing or exhibits significant variation from the output of the A/D converter.

18. A method for verifying a digital output of an analog to digital (A/D) converter, the method comprising:
injecting an injected signal having an identifiable characteristic into an analog input of an A/D converter through electromagnetic field interaction between a signal line carrying a test signal proximate to an analog line associated with the analog input;
generating, via the A/D converter, a digital output comprising a digital version of an analog signal carried by the analog line and the injected signal; and
determining whether the digital output generated by the A/D converter indicates the identifiable characteristic.

19. The method of claim 18, further comprising:
filtering the digital output to remove the injection signal; and
outputting the filtered digital signal as a verified digital output signal responsive to a confirmation that the digital output includes the injected signal.

20. The method of claim 18, wherein determining whether the digital output generated by the A/D converter indicates the identifiable characteristic comprises performing a frequency domain analysis of the digital output using a fast Fourier transform.

* * * * *

UNITED STATES PATENT AND TRADEMARK OFFICE
CERTIFICATE OF CORRECTION

PATENT NO. : 9,698,809 B1
APPLICATION NO. : 15/213993
DATED : July 4, 2017
INVENTOR(S) : Travis C. Mallett Page 1 of 1

It is certified that error appears in the above-identified patent and that said Letters Patent is hereby corrected as shown below:

On the Title Page

Item (73), Assignee, is corrected to "Schweitzer Engineering Laboratories, Inc., Pullman, WA (US)".

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*